(12) United States Patent
Abe et al.

(10) Patent No.: US 11,804,453 B2
(45) Date of Patent: *Oct. 31, 2023

(54) SEMICONDUCTOR DEVICE AND METHOD FOR MANUFACTURING SEMICONDUCTOR DEVICE

(71) Applicant: ROHM CO., LTD., Kyoto (JP)

(72) Inventors: Hidetoshi Abe, Kyoto (JP); Makoto Ikenaga, Kyoto (JP); Kensei Takamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/074,399

(22) Filed: Dec. 2, 2022

(65) Prior Publication Data

US 2023/0096699 A1    Mar. 30, 2023

Related U.S. Application Data

(63) Continuation of application No. 17/260,499, filed as application No. PCT/JP2019/028192 on Jul. 18, 2019, now Pat. No. 11,545,446.

(30) Foreign Application Priority Data

Jul. 20, 2018    (JP) ................................. 2018-136826

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4825* (2013.01); *H01L 21/565* (2013.01);
(Continued)

(58) Field of Classification Search
CPC ............... H01L 23/562; H01L 23/3114; H01L 23/49513; H01L 23/4952; H01L 23/49562; H01L 21/4825; H01L 21/565
See application file for complete search history.

(56) References Cited

U.S. PATENT DOCUMENTS

2014/0264383 A1*   9/2014   Kajiwara ............ H01L 23/3192
                                                                    257/77

FOREIGN PATENT DOCUMENTS

CN         104051401 A    9/2014
JP         1-209733 A     8/1989
(Continued)

OTHER PUBLICATIONS

International Search Report issued in PCT/JP2019/028192, dated Aug. 27, 2019 (2 pages).

(Continued)

*Primary Examiner* — Marc Anthony Armand
(74) *Attorney, Agent, or Firm* — Hamre, Schumann, Mueller & Larson, P.C.

(57) ABSTRACT

A semiconductor device includes a semiconductor element, a lead frame, a conductive member, a resin composition and a sealing resin. The semiconductor element has an element front surface and an element back surface facing away in a first direction. The semiconductor element is mounted on the lead frame. The conductive member is bonded to the lead frame, electrically connecting the semiconductor element and the lead frame. The resin composition covers a bonded region where the conductive member and lead frame are bonded while exposing part of the element front surface. The sealing resin covers part of the leadframe, the semiconductor element, and the resin composition. The resin composition has a greater bonding strength with the lead frame than a bonding strength between the sealing resin and lead frame and a greater bonding strength with the conductive member (Continued)

than a bonding strength between the sealing resin and conductive member.

13 Claims, 26 Drawing Sheets

(51) Int. Cl.
    *H01L 21/56*     (2006.01)
    *H01L 23/31*     (2006.01)
    *H01L 23/495*     (2006.01)

(52) U.S. Cl.
    CPC ...... *H01L 23/3114* (2013.01); *H01L 23/4952* (2013.01); *H01L 23/49513* (2013.01); *H01L 23/49562* (2013.01)

(56) References Cited

FOREIGN PATENT DOCUMENTS

| | | |
|---|---|---|
| JP | 2012-160581 A | 8/2012 |
| JP | 2012-174927 A | 9/2012 |
| JP | 2014-179541 A | 9/2014 |
| JP | 2017-5165 A | 1/2017 |
| JP | 2017-92389 A | 5/2017 |

OTHER PUBLICATIONS

Office Action received in the corresponding Chinese Patent application, dated Jun. 12, 2023, and machine translation (17 pages).
Office Action received in the corresponding Japanese Patent application, dated Jul. 4, 2023, and machine translation (8 pages).

* cited by examiner

SEMICONDUCTOR DEVICE AND METHOD FOR MANUFACTURING SEMICONDUCTOR DEVICE

TECHNICAL FIELD

The present disclosure relates to a semiconductor device and a method for manufacturing a semiconductor device.

BACKGROUND ART

A conventional semiconductor device is disclosed in Patent Document 1. The semiconductor device disclosed in Patent Document 1 includes a semiconductor element, a lead frame, solder, a wire, and a sealing resin. In the semiconductor device, the semiconductor element may be a diode chip or a MOSFET (Metal Oxide Semiconductor Field Effect Transistor). The semiconductor element is mounted on the lead frame, and the lead frame is electrically connected to the semiconductor element with the solder or the wire. The solder and wire serve as conductive members that electrically connect the lead frame and the semiconductor element. That is, solder is interposed between the semiconductor element and the lead frame, electrically connecting these. The wire is bonded to the semiconductor element and the lead frame, electrically connecting these. The sealing resin covers part of the lead frame, the semiconductor element, the solder, and the wire.

TECHNICAL REFERENCE

Patent Document

Patent Document 1: JP-A-2017-5165

SUMMARY OF THE INVENTION

Problems to be Solved by the Invention

A semiconductor device may be subjected to thermal load applied due to e. g. ref lowing in mounting the semiconductor device to a circuit board of an electronic device or due to heat generated from the semiconductor element during operation. Thermal stress due to such thermal load concentrates on the bonded region where the conductive members such as solder or a wire and the lead frame are bonded. Such concentration of thermal stress may cause the sealing resin to be detached at the interface between the bonded region and the sealing resin. If a thermal load is further applied with the sealing resin detached, cracks can occur in the solder as a conductive member. Also, the wire as a conductive member can be detached or broken. These may cause malfunctions of the semiconductor device.

The present disclosure has been proposed under the above-noted circumstances, and an object of the present disclosure is to provide a semiconductor device and a method for manufacturing a semiconductor device which prevent the detachment of the sealing resin due to thermal load and thereby prevent malfunctions.

Means for Solving the Problems

In accordance with a first aspect of the present disclosure, there is provided a semiconductor device including: a semiconductor element having an element front surface and an element back surface facing away from each other in a first direction; a lead frame on which the semiconductor element is mounted; a conductive member bonded to the lead frame, the conductive member electrically connecting the semiconductor element and the lead frame; a resin composition covering a bonded region where the conductive member and the lead frame are bonded while exposing part of the element front surface; and a sealing resin covering part of the lead frame, the semiconductor element and the resin composition. The resin composition has a greater bonding strength with the lead frame than a bonding strength between the sealing resin and the lead frame and also has a greater bonding strength with the conductive member than a bonding strength between the sealing resin and the conductive member.

In a preferable embodiment of the semiconductor device, the lead frame includes a die pad and a lead spaced apart from the die pad, the die pad having a pad front surface facing a direction in which the element front surface faces and a pad back surface facing a direction in which the element back surface faces, and the semiconductor element is mounted on the die pad, with the pad front surface and the element back surface facing each other.

In a preferable embodiment of the semiconductor device, the semiconductor element includes a back-surface electrode formed on the element back surface, the conductive member includes a conductive bonding material bonding the semiconductor element and the die pad and electrically connecting the back-surface electrode and the die pad, and the resin composition includes a die-pad-side covering portion covering a bonded region where the conductive bonding material and the die pad are bonded.

In a preferable embodiment of the semiconductor device, the conductive bonding material has an element contact surface in contact with the back-surface electrode, a die-pad contact surface in contact with the die pad, and a connecting surface connected to the element contact surface and the die-pad contact surface, and the die-pad-side covering portion includes a die-pad-side first portion interposed between the connecting surface and the sealing resin.

In a preferable embodiment of the semiconductor device, the die-pad-side covering portion further includes a due-pad-side second portion connected to the die-pad-side first portion and interposed between the pad front surface and the sealing resin.

In a preferable embodiment of the semiconductor device, the semiconductor element has an element side surface connected to the element front surface and the element back surface, and the die-pad-side covering portion further includes a die-pad-side third portion connected to the die-pad-side first portion and interposed between at least part of the element side surface and the sealing resin.

In a preferable embodiment of the semiconductor device, the die-pad-side covering portion further includes a die-pad-side fourth portion connected to the die-pad-side third portion and interposed between part of the element front surface and the sealing resin.

In a preferable embodiment of the semiconductor device, the conductive bonding material comprises solder.

In a preferable embodiment of the semiconductor device, the pad back surface is exposed from the sealing resin.

In a preferable embodiment of the semiconductor device, the semiconductor element includes a front-surface electrode formed on the element front surface, the conductive member includes a wire bonded to the front-surface electrode and the lead to electrically connect the front-surface electrode and the lead, and the resin composition includes a lead-side covering portion covering a bonded region where the wire and the lead are bonded.

In a preferable embodiment of the semiconductor device, the wire includes a first bond part bonded to the front-surface electrode and a second bond part bonded to the lead, and the lead-side covering portion includes a lead-side first portion interposed between the second bond part and the sealing resin.

In a preferable embodiment of the semiconductor device, the lead-side covering port ion further includes a lead-side second port ion connected to the lead-side first portion and interposed between the lead and the sealing resin.

In a preferable embodiment of the semiconductor device, the wire further includes a line part connecting the first bond part and the second bond part, and the line part includes a sealing-resin contact region that is in contact with the sealing resin along an entire circumference thereof.

In a preferable embodiment of the semiconductor device, the semiconductor element is a power semiconductor chip.

In accordance with a second aspect of the present disclosure, there is provided a method for manufacturing a semiconductor device, where the method includes: a step of preparing a lead frame; a step of preparing a semiconductor element having an element front surface and an element back surface facing away from each other in a first direction; an element mounting step of mounting the semiconductor element on the leadframe; a conductive member provision step of bonding a conductive member to the lead frame and the semiconductor element to electrically connect the lead frame and the semiconductor element with the conductive member; an application step of applying a paste composite material so as to cover a bonded region where the conductive member and the lead frame are bonded while exposing part of the element front surface; a step of drying the applied paste composite material; and a step of forming a sealing resin covering part of the lead frame, the semiconductor element and the dried paste composite material. The paste composite material contains a resin material. The resin material has a greater bonding strength with the lead frame than a bonding strength between the sealing resin and the lead frame and also has a greater bonding strength with the conductive member than a bonding strength between the sealing resin and the conductive member.

In a preferable embodiment of the method for manufacturing a semiconductor device, the lead frame includes a die pad and a lead spaced apart from the die pad, the die pad having a pad front surface facing a direction in which the element front surface faces and a pad back surface facing a direction in which the element back surface faces, and the element mounting step comprises mounting the semiconductor element on the die pad, with the pad front surface and the element back surface facing each other.

In a preferable embodiment of the method for manufacturing a semiconductor device, the semiconductor element includes a back-surface electrode formed on the element back surface. The conductive member provision step comprises applying a conductive paste that bonds the back-surface electrode and the die pad before the element mounting step, and drying the conductive paste after the element mounting step to form a conductive bonding material that bonds the semiconductor element and the die pad and electrically connects the back-surface electrode and the die pad. The application step comprises applying the paste composite material so as to at least cover a bonded region where the conductive bonding material and the die pad are bonded.

In a preferable embodiment of the method for manufacturing a semiconductor device, the semiconductor element includes a front-surface electrode formed on the element front surface, the conductive member provision step comprises providing a wire bonded to the front-surface electrode and the lead to electrically connect the front-surface electrode and the lead after the element bonding step, and the application step comprises applying the paste composite material so as to at least cover a bonded region where the wire and the lead are bonded.

Advantages of the Invention

With the semiconductor device of the present disclosure, detachment of the sealing resin due to thermal load is prevented, so that malfunctions are prevented. Also, the manufacturing method according to the present disclosure makes it possible to manufacture a semiconductor device that prevents malfunctions.

MODE FOR CARRYING OUT THE INVENTION

Figure 1:
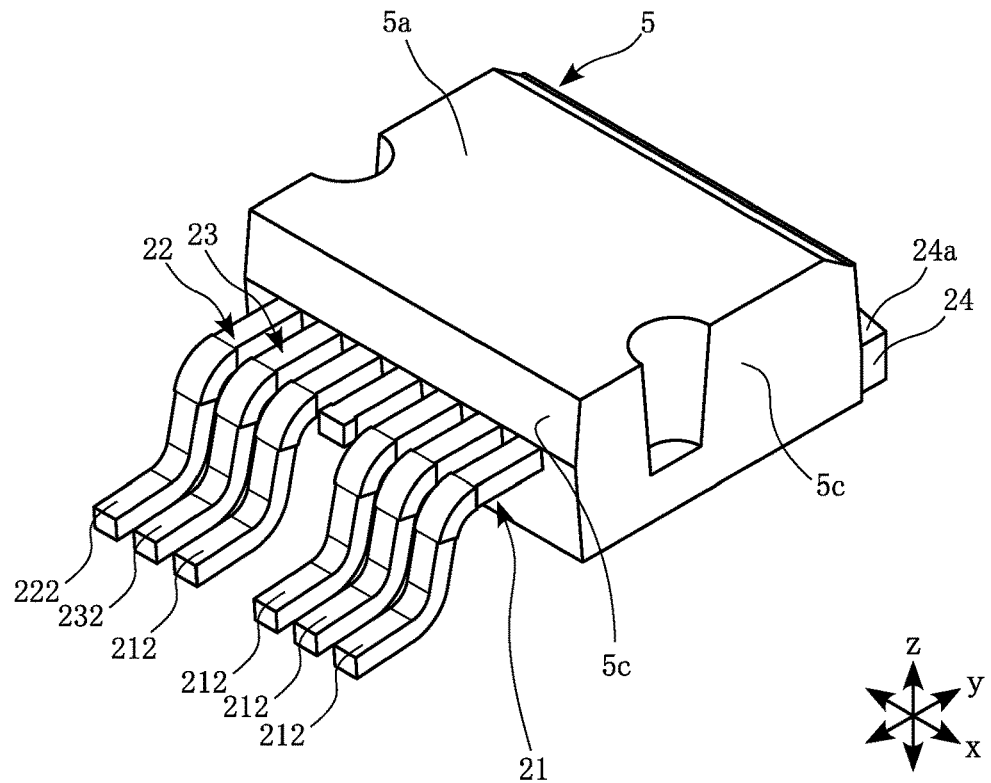
FIG. 1 is a perspective view showing a semiconductor device according to a first embodiment.

Preferred embodiments of a semiconductor device and a method for manufacturing a semiconductor device according to the present disclosure are described below with reference to the drawings.

FIGS. 1-10 show a semiconductor device according to a first embodiment of the present disclosure. The semiconductor device A1 of the first embodiment includes a semiconductor element 1, a lead frame 2, a plurality of wires 3, a conductive bonding material 4, a sealing resin 5 and a resin composition 6. The wires 3 include a plurality of first wires 31, a second wire 32 and a third wire 33.

Figure 2:
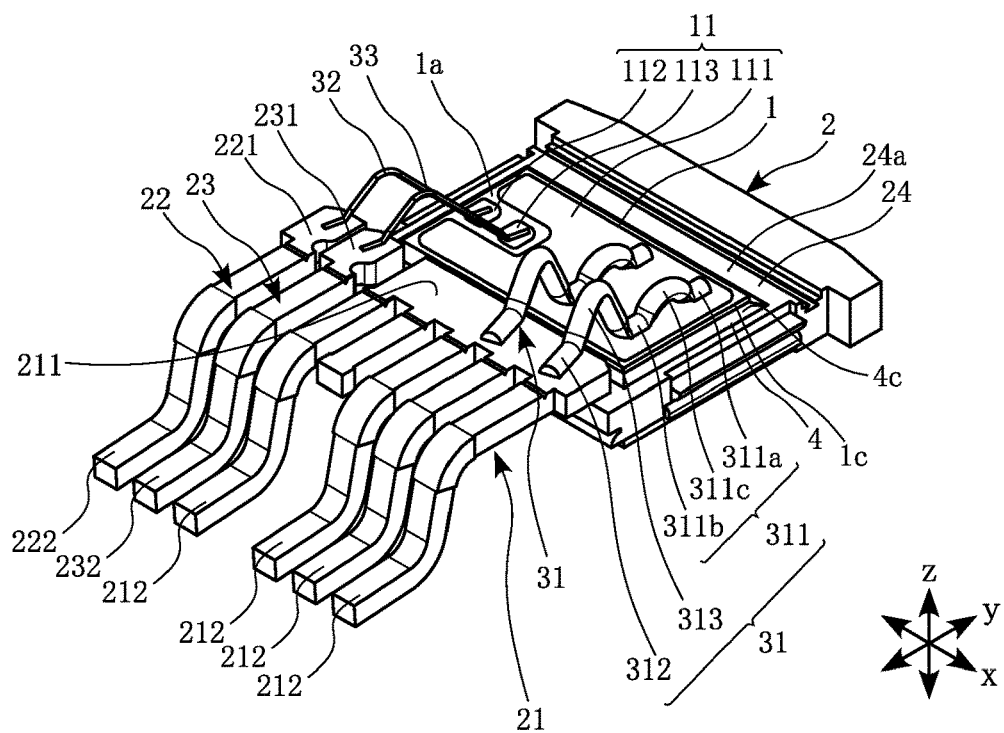
FIG. 2 is a perspective view corresponding to FIG. 1, with a sealing resin and a resin composition omitted.
Figure 3:
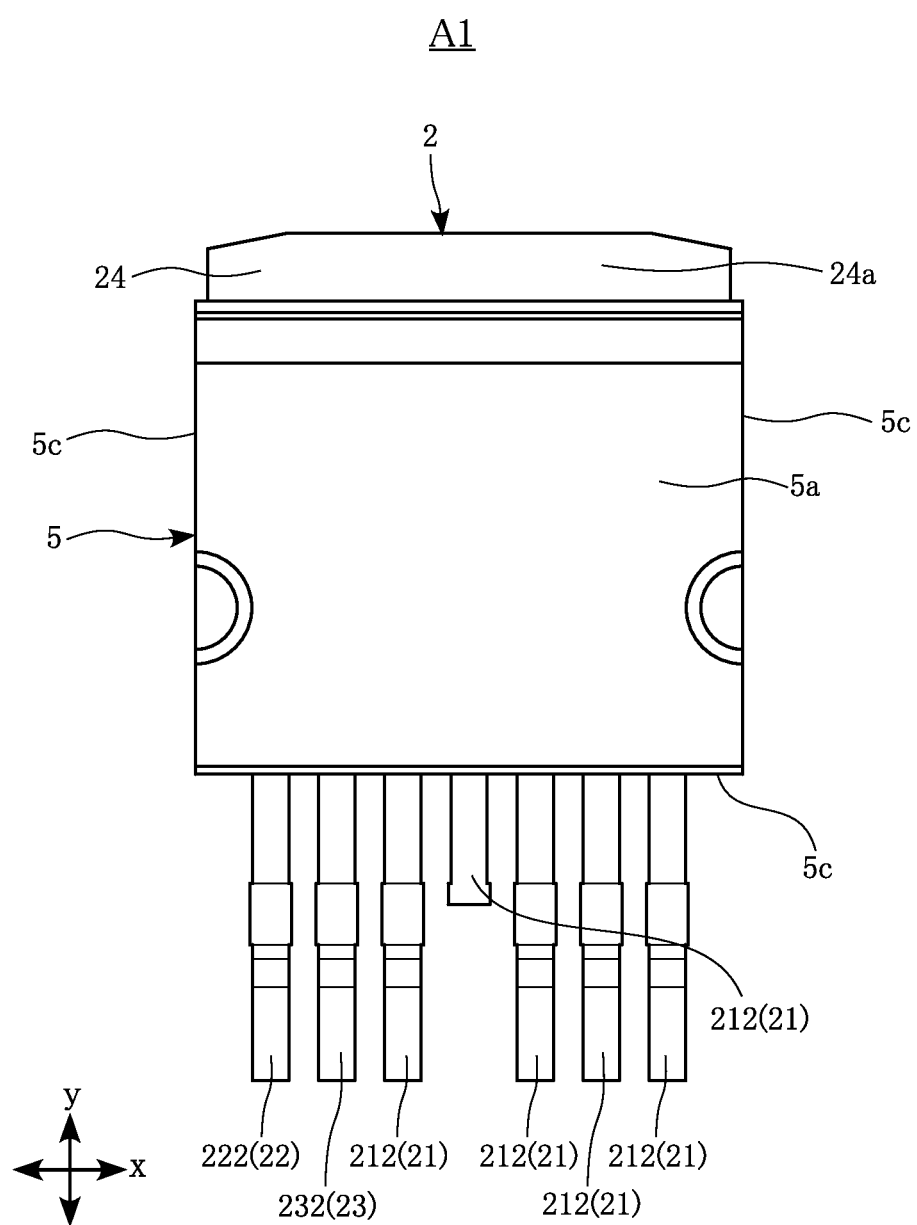
FIG. 3 is a plan view showing the semiconductor device according to the first embodiment.
Figure 4:
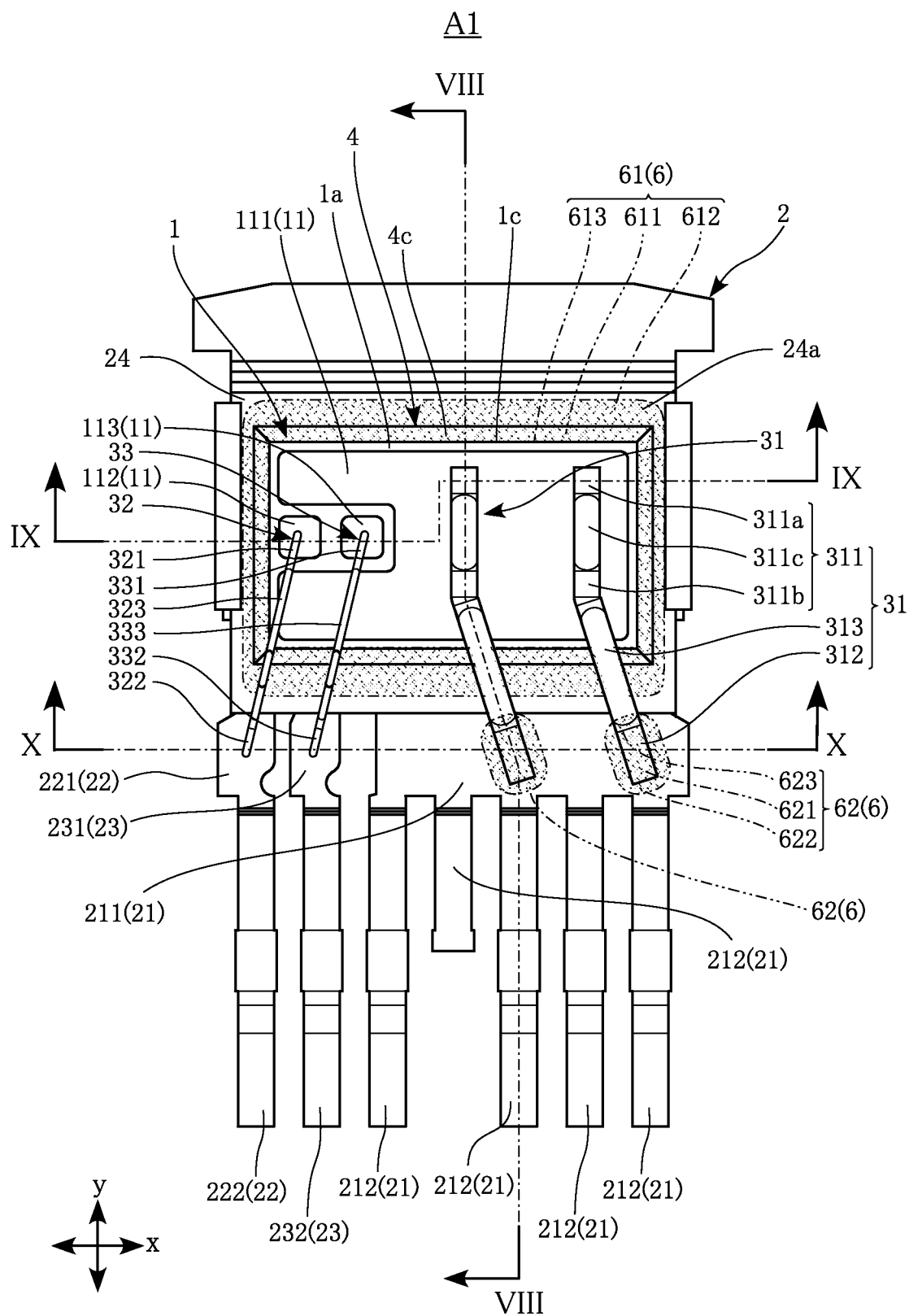
FIG. 4 is a plan view obtained by omitting the sealing resin from FIG. 3.
Figure 5:
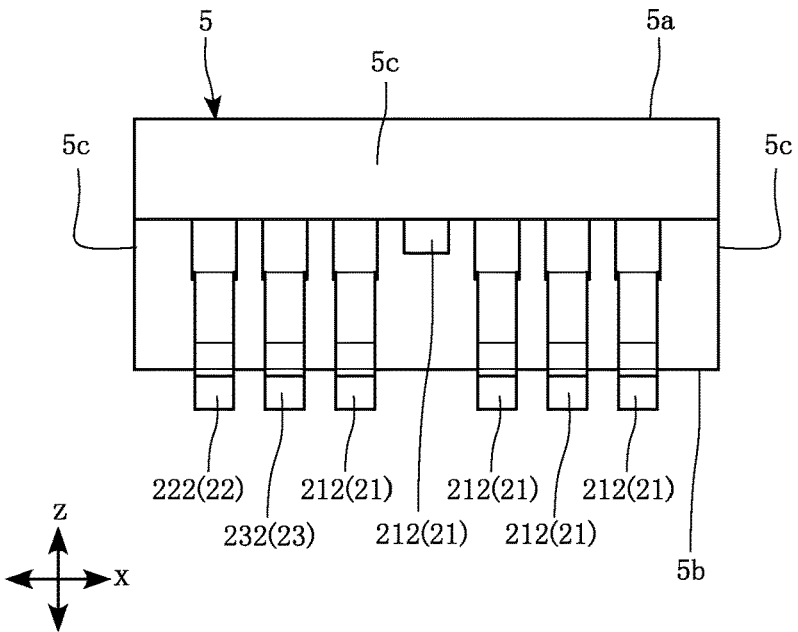
FIG. 5 is a front view showing the semiconductor device according to the first embodiment.
Figure 6:
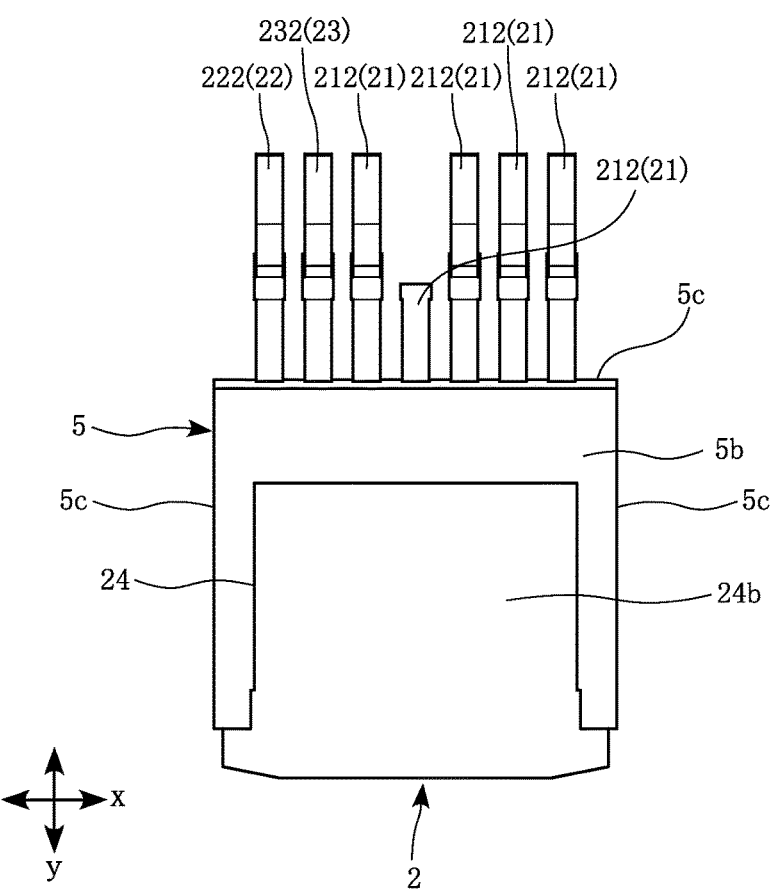
FIG. 6 is a bottom view showing the semiconductor device according to the first embodiment.
Figure 7:
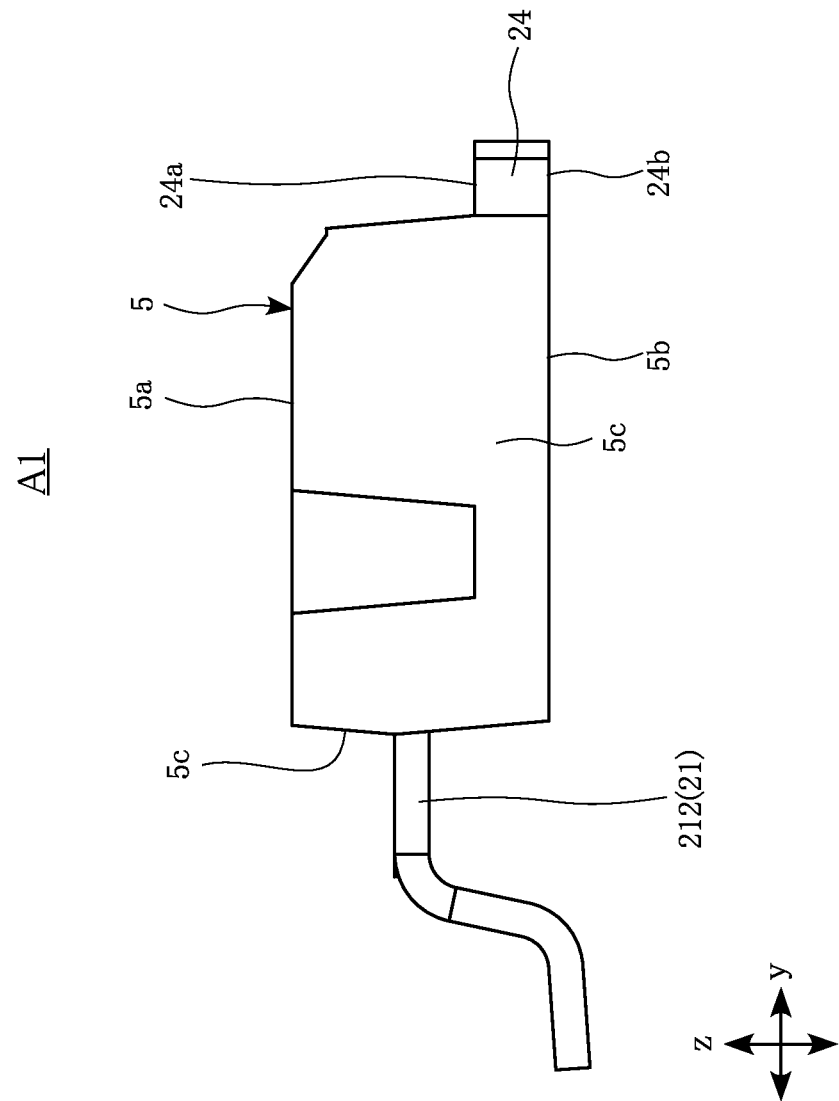
FIG. 7 is a side view (right side view) showing the semiconductor device according to the first embodiment.
Figure 8:
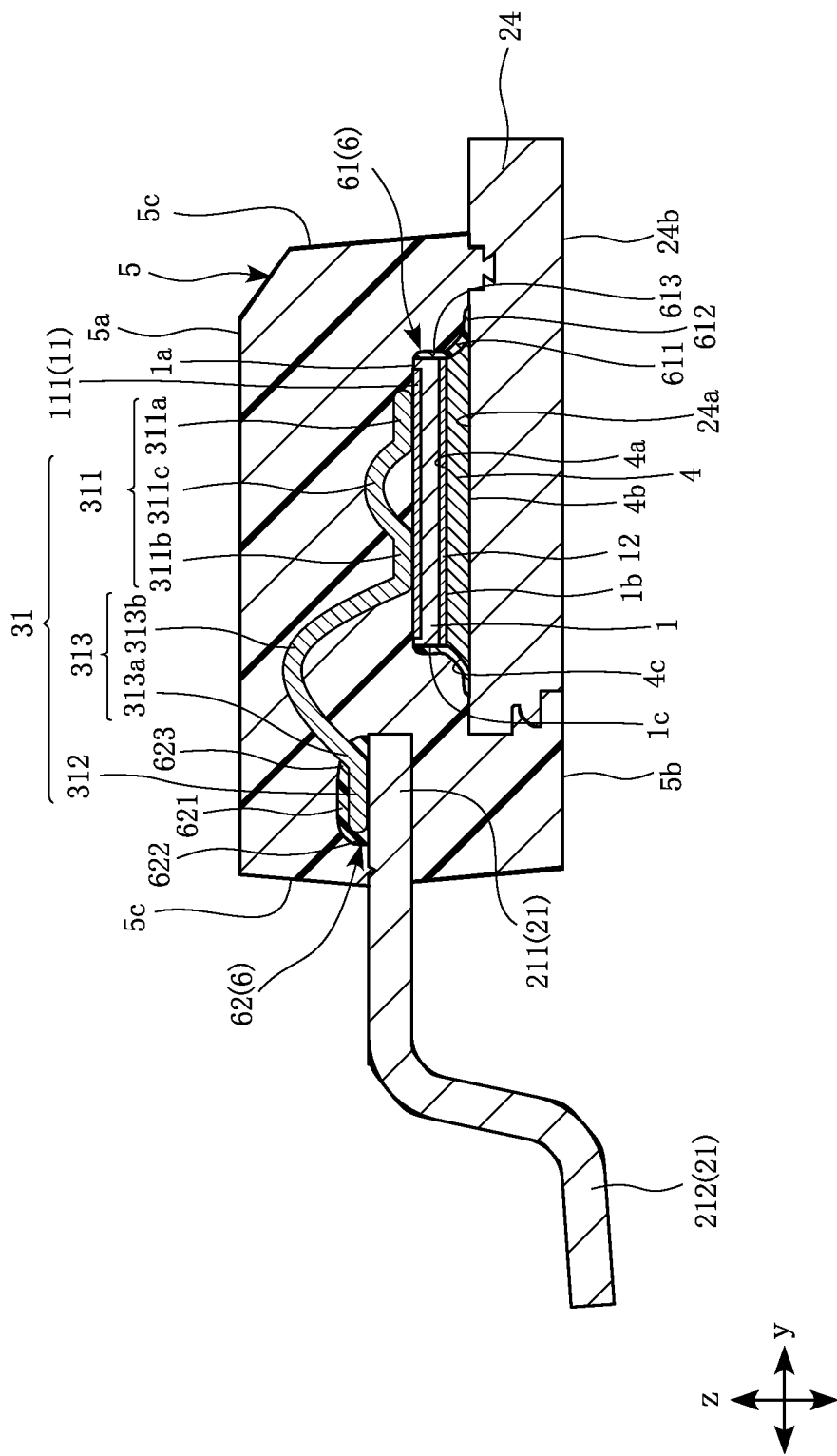
FIG. 8 is a sectional view taken along line VIII-VIII in FIG. 4.
Figure 9:
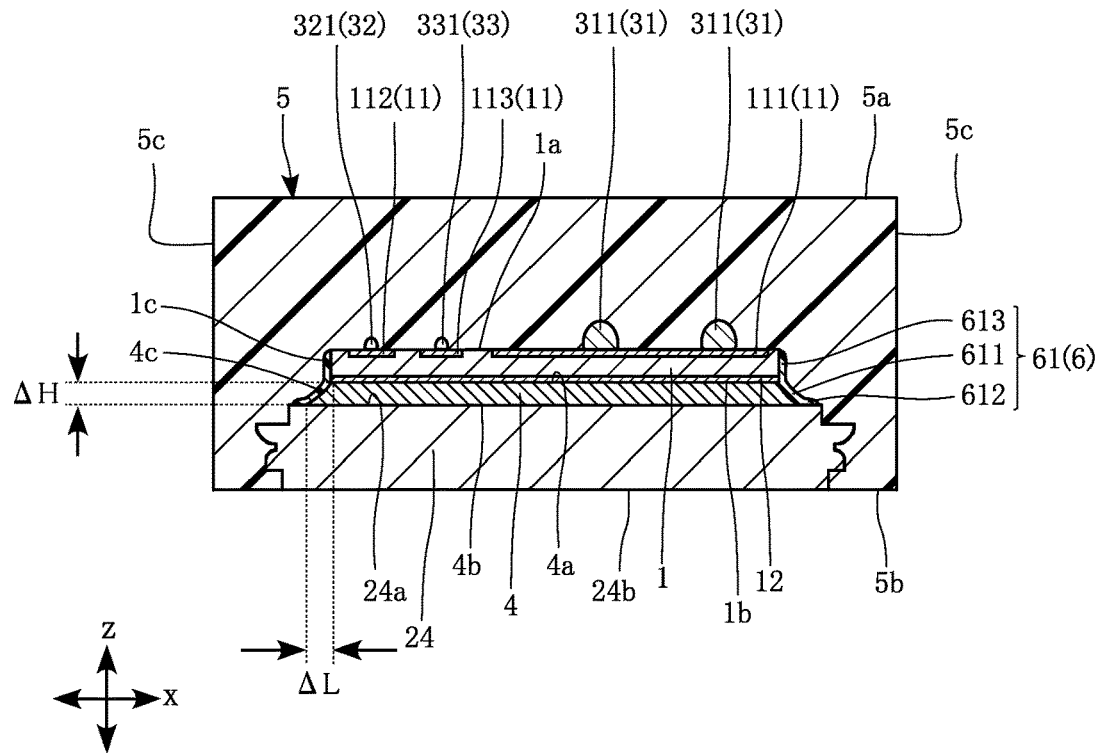
FIG. 9 is a sectional view taken along line IX-IX in FIG. 4.
Figure 10:
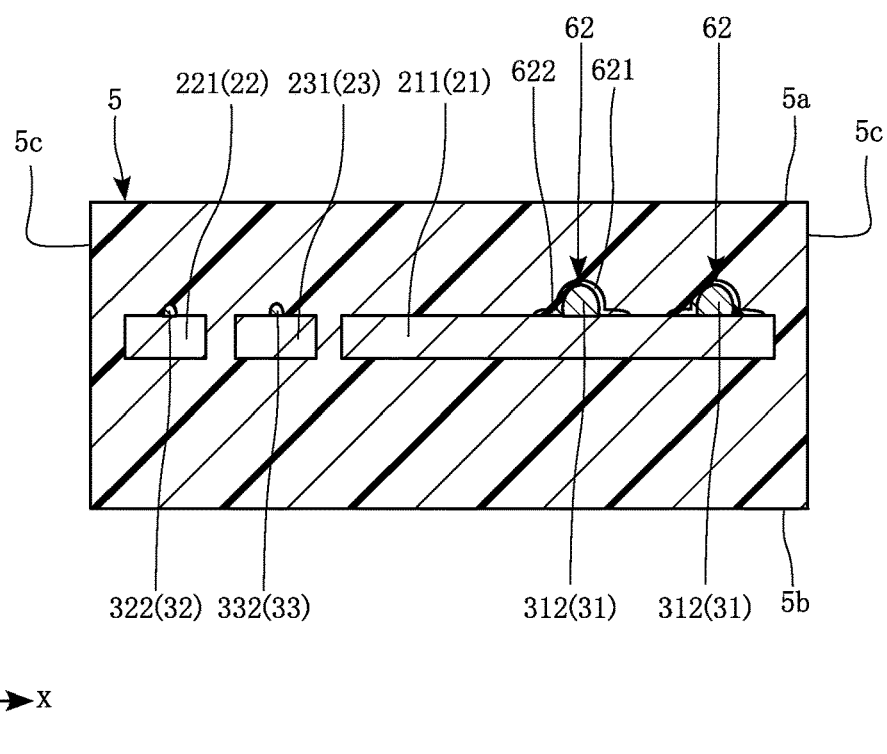
FIG. 10 is a sectional view taken along line X-X in FIG. 4.

FIG. 1 is a perspective view of the semiconductor device A1. FIG. 2 is a perspective view corresponding to FIG. 1, with the sealing resin 5 and the resin composition 6 omitted. FIG. 3 is a plan view of the semiconductor device A1. FIG. 4 is a plan view obtained by omitting the sealing resin 5 from FIG. 3. Note that in FIG. 4 the resin composition 6 is indicated by imaginary lines (and applied with dot patterns for the convenience of understanding). FIG. 5 is a front view of the semiconductor device A1. FIG. 6 is a bottom view of the semiconductor device A1. FIG. 7 is a side view (right side view) of the semiconductor device A1. FIG. 8 is a sectional view taken along line VIII-VIII in FIG. 4. FIG. 9 is a sectional view taken along line IX-IX in FIG. 4. FIG. 10 is a sectional view taken along line X-X in FIG. 4. For the convenience of description, the three directions that are orthogonal to each other are defined as x direction, y direction and z direction, respectively. The x direction is the horizontal direction in plan view (see FIGS. 3 and 4). They direction is the vertical direction in plan view (see FIGS. 3 and 4). The z direction is the thickness (height) direction of the semiconductor device A1.

The semiconductor element 1 is an electronic component that performs the main function of the semiconductor device A1 and made of a semiconductor material. Examples of the semiconductor material include, without limitation, Si (silicon), SiC (silicon carbide) and GaAs (gallium arsenide). The semiconductor element 1 is a power semiconductor chip such as a MOSFET. The present embodiment shows the example in which the semiconductor element 1 is a MOSFET, but the present disclosure is not limited to this, and the semiconductor element may be other types of transistors such as an IGBT (insulated gate bipolar transistor) or a diode such as a Schottky barrier diode or a fast recovery diode. In the present disclosure, a power semiconductor chip is defined as a semiconductor chip configured to be used under the conditions in which the product of the voltage and the current is 1 W or more, where the voltage is the one across an input terminal and an output terminal and the current is the one flowing between the input terminal and the output terminal. In a MOSFET, the input terminal and the output terminal are a drain electrode and a source electrode, respectively. As shown in FIG. 4, the semiconductor element 1 is, for example, rectangular as viewed in plan. As shown in FIGS. 4, 8 and 9, the semiconductor element 1 has an element front surface 1a, an element back surface 1b and a plurality of element side surfaces 1c.

The element front surface 1a and the element back surface 1b are spaced apart and face away from each other in the z direction. Each of the element side surfaces 1c is located between the element front surface 1a and the element back surface 1b. One edge of each element side surface 1c in the z direction (the upper edge in FIGS. 8 and 9) is connected to the element front surface 1a, and the other edge of each element side surface in the z direction (the lower edge in FIGS. 8 and 9) is connected to the element back surface 1b. All of the element front surface 1a, the element back surface 1b and the element side surfaces 1c are generally flat. In the present embodiment, the semiconductor element 1 has a pair of element side surfaces 1c facing away from each other in the x direction and a pair of element side surfaces 1c facing away from each other in the y direction.

As shown in FIGS. 2, 4, 8 and 9, the semiconductor element 1 includes a plurality of front-surface electrodes 11 and a back-surface electrode 12. In this way, the semiconductor element 1 is of a vertical structure type. The front-surface electrodes 11 are formed on the element front surface 1a. As shown in FIGS. 2 and 4, the front-surface electrodes 11 include a first front-surface electrode 111, a second front-surface electrode 112 and a third front-surface electrode 113. The back-surface electrode 12 is formed on the element back surface 1b. The first front-surface electrode 111 is a source electrode, the second front-surface electrode 112 is agate electrode, the third front-surface electrode 113 is a source sense electrode, and the back-surface electrode 12 is a drain electrode. The arrangement, size and shape of the first front-surface electrode 111, the second front-surface electrode 112 and the third front-surface electrode 113 are not limited to those shown in the figures. The third front-surface electrode 113 (source sense electrode) may not be formed. The material for the front-surface electrodes 11 (the first front-surface electrode 111, the second front-surface electrode 112 and the third front-surface electrode 113) and the back-surface electrode 12 may be Al (aluminum), for example.

The lead frame 2, on which the semiconductor element 1 is mounted, is electrically connected to the semiconductor element 1. When mounted on a circuit board of an electronic device for example, the lead frame 2 forms an electrical conduction path between the semiconductor element 1 and the circuit board. The lead frame 2 is made of a conductive material. The conductive material may be Cu (copper), for example. The conductive material is not limited to Cu, and may be Ni (nickel), Cu alloy, Ni alloy, or 42 alloy, for example. The lead frame 2 is formed by working a metal plate such as a copper plate that is rectangular as viewed in plan into an appropriate shape by punching, cutting or bending, for example. As shown in FIGS. 2 and 4, the lead frame 2 includes a first lead 21, a second lead 22, a third lead 23 and a die pad 24. In the lead frame 2, these parts are spaced apart from each other.

The first lead 21 is the part of the lead frame 2 that is electrically connected to the first front-surface electrode 111 (source electrode) of the semiconductor element 1. The first lead 21 is electrically connected to the first front-surface electrode 111 with the first wires 31. As shown in FIGS. 2, 4 and 8, the first lead 21 includes a wire bonding portion 211 and a plurality of terminal portions 212.

One end of each of the first wires 31 is bonded to the wire bonding portion 211. The wire bonding portion 211 is covered with the sealing resin 5.

The terminal portions 212 are connected to the wire bonding portion 211. Part of each terminal portion 212 is exposed from the sealing resin 5. The plurality of terminal portions 212 have the same shape except one. Note however that all terminal portions 212 of the first lead 21 may have a same shape. As viewed in the x direction, the terminal portions 212 overlap with each other. The terminal portions 212 are bonded to a circuit board to function as the source terminal of the semiconductor device A1. As shown in FIGS. 1-6, the first lead 21 has five terminal portions 212. The number, length and shape of the terminal portions 212 are not limited to the example shown in the figures.

The second lead 22 is the part of the lead frame 2 that is electrically connected to the second front-surface electrode 112 (gate electrode) of the semiconductor element 1. The second lead 22 is electrically connected to the second front-surface electrode 112 with the second wire 32. As shown in FIGS. 2 and 4, the second lead 22 includes a wire bonding portion 221 and a terminal portion 222.

One end of the second wire 32 is bonded to the wire bonding portion 221. The wire bonding portion 221 is covered with the sealing resin 5.

The terminal portion 222 is connected to the wire bonding portion 221. Part of the terminal portion 222 is exposed from the sealing resin 5. The part of the terminal portion 222 that is exposed from the sealing resin 5 is partially bent. As viewed in the x direction, the terminal portion 222 overlaps with the terminal portions 212. The terminal portion 222 is bonded to a circuit board to function as the gate terminal of the semiconductor device A1.

The third lead 23 is the part of the lead frame 2 that is electrically connected to the third front-surface electrode 113 (source sense electrode) of the semiconductor element 1. The third lead 23 is electrically connected to the third front-surface electrode 113 with the third wire 33. As shown in FIGS. 2 and 4, the third lead 23 includes a wire bonding portion 231 and a terminal portion 232.

One end of the third wire 33 is bonded to the wire bonding portion 231. The wire bonding portion 231 is covered with the sealing resin 5.

The terminal portion 232 is connected to the wire bonding portion 231. Part of the terminal portion 232 is exposed from the sealing resin 5. The part of the terminal portion 232 that is exposed from the sealing resin 5 is partially bent. As viewed in the x direction, the terminal portion 232 overlaps with the terminal portions 212 and the terminal portion 222. In the x direction, the terminal portions 232 is located between the terminal portions 212 and the terminal portions 222. The terminal portion 232 is bonded to a circuit board to function as the source sense terminal of the semiconductor device A1.

The die pad 24 is the part of the lead frame 2 on which the semiconductor element 1 is mounted. Part of die pad 24 is covered with the sealing resin 5, while the other part is exposed from the sealing resin 5. As shown in FIGS. 8 and 9, the die pad 24 has a pad front surface 24a and a pad back surface 24b.

The pad front surface 24a and the pad back surface 24b are spaced apart and face away from each other in the z direction. The pad front surface 24a faces the direction in which the element front surface 1a faces. The pad front surface 24a faces the element back surface 1b. The pad back surface 24b faces the direction in which the element back surface 1b faces. The pad back surface 24b is exposed from the sealing resin 5.

The die pad 24 is electrically connected to the back-surface electrode 12 (the drain electrode) with the conductive bonding material 4. The die pad 24 is bonded to a circuit board to function as the drain terminal of the semiconductor device A1.

The first wires 31, the second wire 32 and the third wire 33 are connecting members that electrically connect the semiconductor element 1 and the lead frame 2.

The first wires 31 are bonding wires containing Al. Specifically, the first wires 31 may be made of Al alloy containing e.g. Fe (iron), Si or Ni, or pure Al. Alternatively, the first wires 31 may be bonding wires containing Cu or Au (gold) instead of Al. Also, the first wires 31 may not be bonding wires but may be bonding ribbons. The present embodiment shows the example in which the semiconductor device A1 has two first wires 31, but the number of the first wires 31 is not limited. The diameter of each first wires 31 is e.g. about 400 μm. As shown in FIGS. 2, 4 and 8, each of the first wires 31 includes a first bond part 311, a second bond part 312 and a line part 313.

The first bond part 311 is one end of each first wire 31 that is bonded to the first front-surface electrode 111 of the semiconductor element 1. As shown in FIGS. 2, 4 and 8, the first bond part 311 includes a front contact portion 311a, a rear contact portion 311b and an intermediate portion 311c. The front contact portion 311a and the rear contact portion 311b are both in contact with the first front-surface electrode 111. The front contact portion 311a is on the farther side from the second bond part 312, whereas the rear contact portion 311b is on the closer side to the second bond part 312. The intermediate portion 311c is located between the front contact portion 311a and the rear contact portion 311b. The intermediate portion 311c is not bonded to the first front-surface electrode 111 but is slightly raised above the first front-surface electrode 111 to have an arcuate shape. In this way, the first bond part 311 is in contact with the first front-surface electrode 111 at two locations (i.e., includes the front contact portion 311a and the rear contact portion 311b) in the present embodiment, but the first bond part may be in contact with the first front-surface electrode 111 at one location.

The second bond part 312 is the other end of each first wire 31 that is bonded to the wire bonding portion 211 of the first lead 21. The second bond part 312 is covered with the resin composition 6.

The line part 313 extends from each of the first bond part 311 and the second bond part 312, connecting the first bond part 311 and the second bond part 312. The line part 313 is circular in cross section orthogonal to the longitudinal direction. The line part 313 includes a resin-composition contact region 313a and a sealing-resin contact region 313b. The resin-composition contact region 313a is covered with the resin composition 6. The resin-composition contact region 313a is in contact with the resin composition 6 along the entire circumference. The sealing-resin contact region 313b is not covered with the resin composition 6 but covered with the sealing resin 5. The sealing-resin contact region 313b is in contact with the sealing resin 5 along the entire circumference.

The first wires 31 electrically connect the first front-surface electrode 111 and the first lead 21. In the semiconductor device A1, the first wires 31 and the first front-surface electrode 111 are both made of metal containing A1. Thus, the influence of thermal stress is small at the regions where these are bonded.

The second wire 32 is a bonding wire containing Au. Alternatively, the second wire 32 may be a bonding wire containing A1 or Cu instead of Au. The diameter of the second wire 32 is smaller than that of the first wires 31. That is, the second wire 32 is thinner than the first wires 31. The diameter of the second wire 32 is e.g. about 50 to 75 μm. The diameter of the second wire 32 may be varied as appropriate in accordance with the material for the second wire 32. As shown in FIG. 4, the second wire 32 includes a first bond part 321, a second bond part 322 and a line part 323.

The first bond part 321 is one end of the second wire 32 that is bonded to the second front-surface electrode 112 of the semiconductor element 1.

The second bond part 322 is the other end of the second wire 32 that is bonded to the wire bonding portion 221.

The line part 323 extends from each of the first bond part 321 and the second bond part 322, connecting the first bond part 321 and the second bond part 322. The line part 323 is circular in cross section orthogonal to the longitudinal direction.

The second wire 32 electrically connects the second front-surface electrode 112 and the second lead 22.

The third wire 33 is a bonding wire containing Au. Alternatively, the third wire 33 may be a bonding wire containing A1 or Cu instead of Au. The third wire 33 is made of the same material and has the same diameter as the second wire 32, but may be made of a different material and have a different diameter from the second wire 32. The diameter of the third wire 33 may be varied as appropriate in accordance with the material for the third wire 33. As shown in FIG. 4, the third wire 33 includes a first bond part 331, a second bond part 332 and a line part 333.

The first bond part 331 is one end of the third wire 33 that is bonded to the third front-surface electrode 113 of the semiconductor element 1. When the front-surface electrode 11 does not include the third front-surface electrode 113 (source sense electrode), the first bond part 331 may be bonded to the first front-surface electrode 111 (source electrode) to enable detection of the source current.

The second bond part 332 is the other end of the third wire 33 that is bonded to the wire bonding portion 231.

The line part 333 extends from each of the first bond part 331 and the second bond part 332, connecting the first bond part 331 and the second bond part 332. The line part 333 is circular in cross section orthogonal to the longitudinal direction.

The third wire 33 electrically connects the third front-surface electrode 113 and the third lead 23.

The conductive bonding material 4 bonds the semiconductor element 1 to the lead frame 2. As shown in FIGS. 8 and 9, the conductive bonding material 4 is interposed between the element back surface 1b of the semiconductor element 1 and the pad front surface 24a of the die pad 24, electrically connecting the back-surface electrode 12 of the semiconductor element 1 and the die pad 24. The conductive bonding material 4 is solder, for example. The type of the solder is not particularly limited, and examples of the solder include lead-free solders such as Sn—Sb alloys or Sn—Ag alloys, and lead-containing solders such as Sn—Pb alloys.

As shown in FIGS. 8 and 9, the conductive bonding material 4 has an element contact surface 4a, a die-pad contact surface 4b and a connecting surface 4c. The element contact surface 4a is in contact with the element back surface 1b of the semiconductor element 1. The element contact surface 4a may be generally flat. The die-pad contact surface 4b is in contact with the pad front surface 24a of the die pad 24. The die-pad contact surface 4b may be generally flat. The connecting surface 4c is located between the element contact surface 4a and the die-pad contact surface 4b, connecting these contact surfaces. The connecting surface 4c may be generally flat or may be curved. As shown in FIGS. 8 and 9, the connecting surface 4c is inclined with respect to the element contact surface 4a and the die-pad contact surface 4b. The angle formed by the element contact surface 4a and the connecting surface 4c is about 0.3° to 27°, for example. The dimension (thickness) ΔH (see FIG. 9) of the conductive bonding material 4 in the z direction is about 10 to 150 μm, for example. The protruding dimension ΔL (see FIG. 9), i.e., the amount by which the conductive bonding material 4 protrudes outward from each element side surface 1c as viewed in plan is about 300 to 2000 μm, for example. Note that the above-described angle and dimensions ΔH, ΔL are the values that include manufacturing errors and can be measured with the manufactured semiconductor device A1. As the design values at the time of manufacture, the above angle may be about 1 to 15°, the dimension ΔH of the conductive bonding material 4 in the z direction may be about 30 to 130 μm, and the protruding dimension ΔL of the conductive bonding material 4 may be about 500 to 1500 μm, for example.

The sealing resin 5 covers the semiconductor element 1, part of the lead frame 2, the wires 3 and the resin composition 6. The sealing resin 5 is a thermosetting synthetic resin that is electrically insulative. The sealing resin 5 may be made of a black epoxy resin mixed with a filler. The filler may be a particulate filler having a particle diameter of about 75 μm, for example. As shown in FIGS. 1, 3 and 5-10, the sealing resin 5 has a resin front surface 5a, a resin back surface 5b and a plurality of resin side surfaces 5c.

The resin front surface 5a and the resin back surface 5b are spaced apart and face away from each other in the z direction. The resin front surface 5a faces the direction in which the element front surface 1a faces, and the resin back surface 5b faces the direction in which the element back surface 1b faces. Each of the resin side surfaces 5c is located between the resin front surface 5a and the resin back surface 5b. One edge of each resin side surface 5c in the z direction is connected to the resin front surface 5a, and the other edge of each resin side surface in the z direction is connected to the resin back surface 5b. In the present embodiment, the sealing resin 5 has a pair of resin side surfaces 5c spaced apart from each other in the x direction and a pair of resin side surfaces 5c spaced apart from each other in the y direction.

In the present embodiment, the first lead 21, the second lead 22 and the third lead 23 project from one of the resin side surfaces 5c. Also, part of the die pad 24 projects from another resin side surface 5c. Specifically, as viewed in plan, the first, the second and the third leads 22, 23, 24 and the die pad 24 project from mutually opposite resin side surfaces 5c of the sealing resin 5. The pad back surface 24b of the die pad 24 is exposed from the resin back surface 5b.

The resin composition 6 is provided to cover the bonded region where the conductive bonding material 4 and the die pad 24 are bonded, and the bonded region where the first wires 31 and the first lead 21 are bonded. The resin composition 6 has a greater bonding strength with the lead frame 2 than the bonding strength between the sealing resin 5 and the lead frame 2. Also, the resin composition 6 has a greater bonding strength with the conductive bonding material 4 than the bonding strength between the sealing resin 5 and the conductive bonding material 4, and a greater bonding strength with the wires 3 than the bonding strength between the sealing resin 5 and the wires 3. The superiority or inferiority of the bonding strength may be determined based on "pudding cup strength" (unit: Mpa). The pudding cup strength represents the shear strength of a resin material (e.g; material for the resin composition 6 or the sealing resin 5) formed into the shape of a pudding cup and held in close contact with a bonding target (e.g., material for the lead frame 2, the conductive bonding material 4 or the wires 3). A higher pudding cup strength indicates a greater bonding strength, and a lower pudding cup strength indicates a lower bonding strength. The resin composition 6 may be made of a material containing, for example, a thermoplastic resin, an epoxy resin, a coupling agent, a powdered inorganic filler, and powders with rubber elasticity. The resin composition 6 is e.g. about 10 to 20 µM in thickness. The material and thickness of the resin composition 6 are not limited to those described above. As shown in FIGS. 4 and 8, the resin composition 6 includes a die-pad-side covering portion 61 and a lead-side covering portion 62. The die-pad-side covering portion 61 and the lead-side covering portion 62 are spaced apart from each other.

The die-pad-side covering portion 61 covers the bonded region where the conductive bonding material 4 and the die pad 24 are bonded. Hereinafter, this bonded region is referred to as a die-pad-side bonded region. As shown in FIGS. 4, 8 and 9, the die-pad-side covering portion 61 includes a die-pad-side first portion 611, a die-pad-side second portion 612 and a die-pad-side third portion 613. The die-pad-side first portion 611, the die-pad-side second portion 612 and the die-pad-side third portion 613 are integrally formed.

As shown in FIG. 8, the die-pad-side first portion 611 is interposed between the connecting surface 4c of the conductive bonding material 4 and the sealing resin 5.

As shown in FIG. 8, the die-pad-side second portion 612 is interposed between the pad front surface 24a of the die pad 24 and the sealing resins. The die-pad-side second portion 612 is connected to the die-pad-side first portion 611. Specifically, the die-pad-side second portion 612 is connected to the lower edge in the z direction of the die-pad-side first portion 611. In the present embodiment, the die-pad-side second portion 612 covers only part of the portion of the pad front surface 24a that is not in contact with the die-pad contact surface 4b of the conductive bonding material 4. However, the die-pad-side second portion may cover the entirety of the portion of the pad front surface 24a that is not in contact with the die-pad contact surface 4b of the conductive bonding material 4.

As shown in FIG. 8, the die-pad-side third portion 613 is interposed between each element side surface 1c of the semiconductor element 1 and the sealing resin 5. The die-pad-side third portion 613 is connected to the die-pad-side first portion 611. Specifically, the die-pad-side third portion 613 is connected to the upper edge in the z direction of the die-pad-side first portion 611. In the present embodiment, as viewed in the x direction or the y direction, the die-pad-side third portion 613 is located below the element front surface 1a in the z direction.

The lead-side covering portion 62 covers the bonded region where the first wires 31 and the first lead 21 are bonded. Hereinafter, this bonded region is referred to as a lead-side bonded region. As shown in FIGS. 4 and 8, the lead-side covering portion 62 includes a lead-side first portion 621, a lead-side second portion 622 and a lead-side third portion 623. The lead-side first portion 621, the lead-side second portion 622 and the lead-side third portion 623 are integrally formed.

As shown in FIG. 8, the lead-side first portion 621 is interposed between the second bond part 312 of each first wire 31 and the sealing resin 5.

As shown in FIG. 8, the lead-side second portion 622 is interposed between the wire bonding portion 211 of the first lead 21 and the sealing resin 5. The lead-side second portion 622 is connected to the lead-side first portion 621.

As shown in FIG. 8, the lead-side third portion 623 is interposed between a part of the line part 313 (the resin-composition contact region 313a) of each first wire 31 and the sealing resin 5. Specifically, the lead-side third portion 623 is formed on a part of the line part 313 that is offset toward the second bond part 312. The lead-side third portion 623 is connected to the lead-side first portion 621.

A method for manufacturing the semiconductor device A1 is described below with reference to FIGS. 11-13. Note that in FIGS. 11-13, the elements that are identical or similar to those shown in FIGS. 1-10 are denoted by the same reference signs as those used in FIGS. 1-10.

Figure 11:
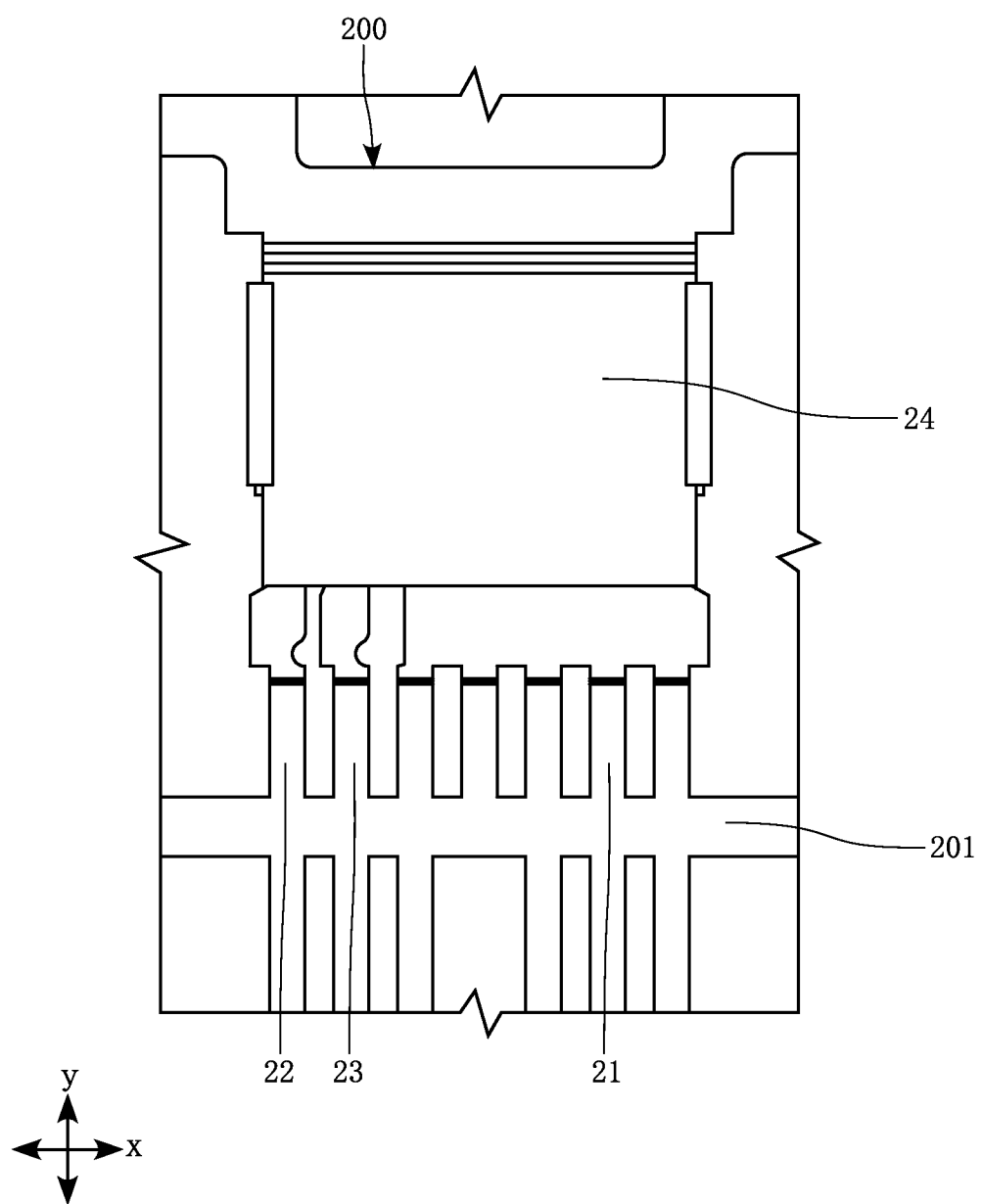
FIG. 11 shows a step of a method for manufacturing the semiconductor device according to the first embodiment.

First, as shown in FIG. 11, a lead frame 200 and a semiconductor element 1 are prepared. The prepared lead frame 200 includes a first lead 21, a second lead 22, a third lead 23 and a die pad 24, which are connected to each other by a frame part 201. The lead frame 200 may have a size that allows production of a plurality of semiconductor devices A1. A MOSFET having a vertical structure is prepared as the semiconductor element 1, but a MOSFET having a horizontal structure may be prepared instead. The semiconductor element 1 is formed with a first front-surface electrode 111, a second front-surface electrode 112 and a third front-surface electrode 113 on the element front surface 1a, and a back-surface electrode 12 on the element back surface 1b.

Figure 12:
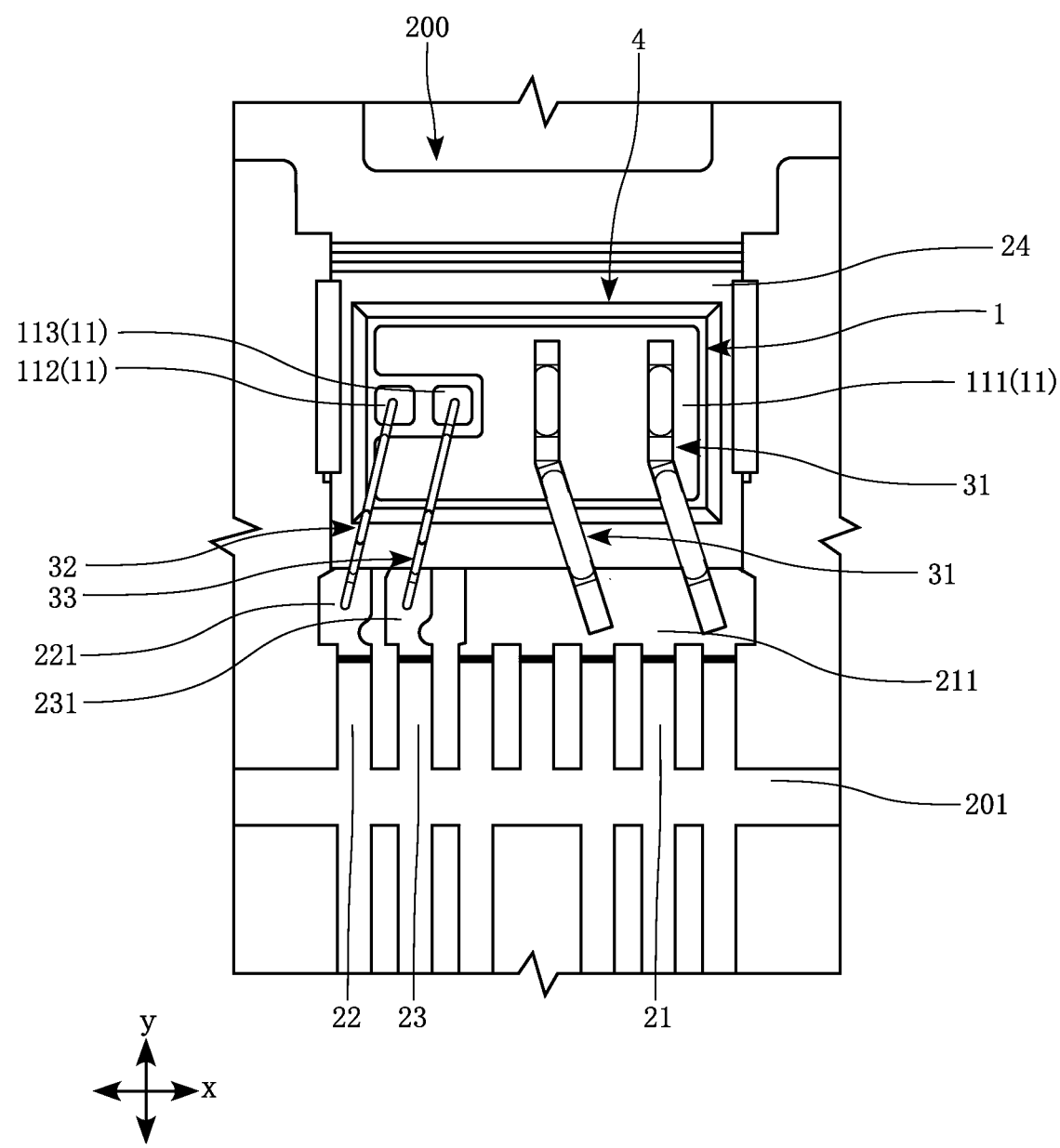
FIG. 12 shows a step of a method for manufacturing the semiconductor device according to the first embodiment.

Next, as shown in FIG. 12, the semiconductor element 1 is mounted on the die pad 24 via a conductive bonding material 4. In this step of mounting the semiconductor element 1 (element mounting step), a conductive paste is applied to the pad front surface 24a of the die pad 24. In the present embodiment, solder paste is used as the conductive paste. Next, the semiconductor element 1 is placed on the applied conductive paste. At this time, the semiconductor element 1 is placed, with the pad front surface 24a and the element back surface 1b facing each other. Next, the conductive paste is baked, whereby the conductive bonding material 4 is formed, and the mounting of the semiconductor element 1 onto the die pad 24 is thus completed. The conductive bonding material 4 bonds and electrically connects the lead frame 200 (die pad 24) and the semiconductor element 1 (back-surface electrode 12).

Next, as shown in FIG. 12, the first wires 31, the second wire 32 and the third wire 33 are bonded to the semiconductor element 1 and the lead frame 200. Bonding these wires 3 uses a known wire bonder. The present embodiment describes wedge bonding using a wedge tool, but ball bonding using a capillary may be employed. The first wires 31 are bonding wires containing Al as the main ingredient. The second wire 32 and the third wire 33 are bonding wires containing Au as the main ingredient. One end of each first wire 31 is bonded to the first front-surface electrode 111, and the other end of each first wire 31 is bonded to the wire bonding portion 211 of the first lead 21. One end of the second wire 32 is bonded to the second front-surface electrode 112, and the other end of the second wire 32 is bonded to the wire bonding portion 221 of the second lead 22. One end of the third wire 33 is bonded to the third front-surface electrode 113, and the other end of the third wire 33 is bonded to the wire bonding portion 231 of the third lead 23. The order in which the first wires 31, the second wire 32 and the third wire 33 are bonded is not limited.

The step of bonding each first wire 31 may be performed as follows. First, while the tip of a wedge is pressed against the first front-surface electrode 111, ultrasonic vibration is applied. By this process, one end of the first wire 31 is fused, due to ultrasonic energy, onto the first front-surface electrode 111, whereby the front contact portion 311a is formed. Next, the wedge is slightly moved while dispensing the first wire 31 from the tip of the wedge, and then the tip of the wedge is again pressed against the first front-surface electrode 111 while ultrasonic vibration is applied. This process forms the intermediate portion 311c and the rear contact portion 311b, whereby the first bond part 311 is completed. Next, the wedge is moved while dispensing the first wire 31 from the tip of the wedge, whereby the line part 313 is formed. Next, while the first wire 31 is pressed against the wire bonding portion 211 of the first lead 21, ultrasonic vibration is applied. By this process, the other end of the first wire 31 is fused, due to ultrasonic energy, onto the wire bonding portion 211. Next, the wedge is slightly moved, and a cut is made in the first wire 31 with a cutter of the wedge tool. The wedge along with the first wire 31 is then further moved away from the wire bonding portion 211, causing the first wire 31 to be cut. Thus, the second bond part 312 is formed. In this way, one end (first bond part 311) of the first wire 31 is bonded to the first front-surface electrode 111, and the other end (second bond part 312) of the first wire 31 is bonded to the wire bonding portion 211. Thus, the first front-surface electrode 111 and the wire bonding portion 211 (first lead 21) are electrically connected to each other with the first wire 31. Note that the steps of bonding the second wire 32 and the third wire 33 are generally the same as the bonding steps of the first wires 31.

Figure 13:
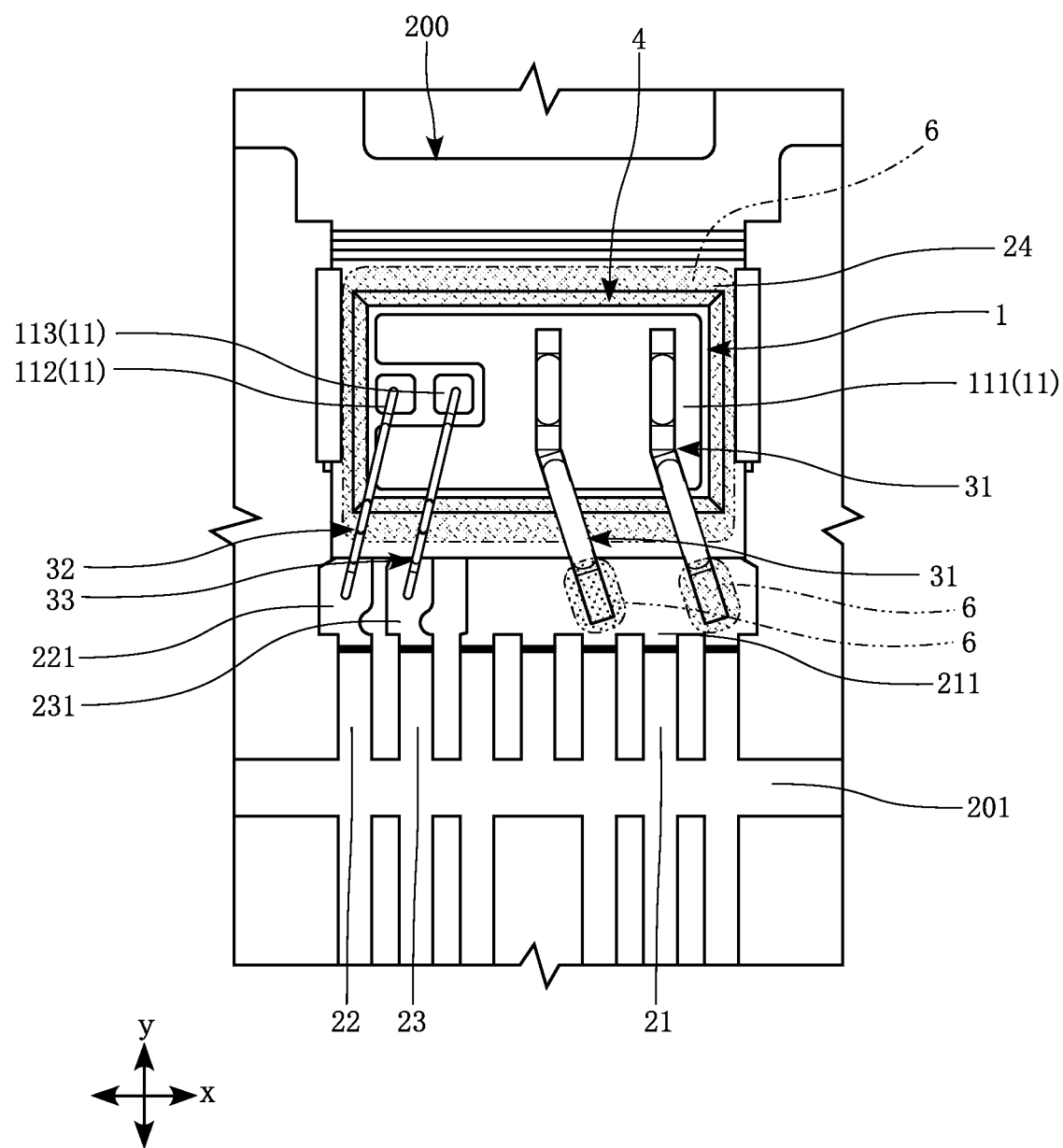
FIG. 13 shows a step of a method for manufacturing the semiconductor device according to the first embodiment.

Next, the resin composition 6 is formed, as shown in FIG. 13. To form the resin composition 6, a paste composite material is applied to the area where the resin composition 6 is to be formed. The step of applying the paste composite material (application step) may be performed using a jet dispenser, for example. Instead of using a jet dispenser, the application step may be performed by other application techniques such as spray coating or spin coating, or by screen printing, for example. In the present embodiment, the paste composite material is applied to the surface region of the conductive bonding material 4 around the semiconductor element 1, as viewed in plan. The paste composite material includes at least a resin material and an organic solvent. The resin material has a greater bonding strength with the lead frame 200 than the bonding strength between the sealing resin 5 and the lead frame 200. Also, the resin material has a greater bonding strength with the wires 3 than the bonding strength between the sealing resin 5 and the wires 3, and a greater bonding strength with the conductive bonding material 4 than the bonding strength between the sealing resin 5 and conductive bonding material 4. In the present embodiment, the paste composite material may contain a thermoplastic resin, an epoxy resin, a coupling agent, a powdered inorganic filler, powders with rubber elasticity, and an organic solvent, for example. The applied paste composite material is then dried to allow the organic solvent to be volatilized, whereby the solidified resin composition 6 is obtained.

Next, the sealing resin 5 is formed. The sealing resin 5 may be formed by molding using a mold, for example. As the material for the sealing resin 5, use may be made of an epoxy resin mixed with a particulate filler. After the sealing resin 5 is formed, the lead frame 200 is cut for division into individual pieces for the semiconductor elements 1. Before or after cutting the lead frame 200, various processes may be performed as appropriate such as a process to improve the strength against bending of the lead frame 2 at portions exposed from the sealing resin 5, a process to improve adhesion to a printed board during the mounting, exterior treatment for rust prevention, lead working to bend the lead frame 2 into a predetermined shape at portions exposed from the sealing resin 5, a stamping process to stamp a company name, a product name, a lot number, etc. on the sealing resin 5, and an inspection/sorting process to determine the quality of the products. Note that these processes may be performed as appropriate in accordance with the specification of the final semiconductor device A1.

By going through the steps described above, the semiconductor device A1 shown in FIGS. 1-10 is obtained.

The advantages of the semiconductor device A1 according to the first embodiment are described below.

The semiconductor device A1 includes the resin composition 6. The resin composition 6 covers the bonded region (e.g., the die-pad-side bonded region or the lead-side bonded region) where the conductive members (e.g., the conductive bonding material 4 or the first wires 31) and the lead frame 2 are bonded. The bonding strength between the resin composition 6 and the lead frame 2 is greater than the bonding strength between the sealing resin 5 and the lead frame 2. Also, the bonding strength between the resin composition 6 and the conductive members is greater than the bonding strength between the sealing resin 5 and the conductive members. With such an arrangement, the resin composition 6 serves as an adhesive to improve the bonding strength between the above-described bonded region and the sealing resin 5. Thus, even when a thermal load is applied to the semiconductor device A1, detachment between the bonded region and the sealing resin 5 is prevented. Thus, in the semiconductor device A1, malfunctions due to detachment of the sealing resin 5 are prevented.

In the semiconductor device A1, the element front surface 1a of the semiconductor element 1 is exposed from the resin composition 6. That is, the element front surface 1a is not covered with the resin composition 6. During the operation of the semiconductor device A1, the semiconductor element 1 tends to generate heat in proximity to the element front surface 1a side. If the element front surface 1a is covered with the resin composition 6, such heat generated in proximity to the element front surface 1a tends to be retained in the case where the thermal conductivity of the resin composition 6 is lower than that of the sealing resin 5. This increases the temperature difference at the interface between the resin composition 6 and the element front surface 1a. The thermal stress, caused by such an increased temperature difference, may cause malfunctions of the semiconductor device A1. Thus, when the thermal conductivity of the resin composition 6 is lower than that of the sealing resin 5, exposing the element front surface 1a from the resin composition 6 makes the temperature difference at the interface of the element front surface 1a smaller, as compared with when the element front surface 1a is covered with the resin composition 6. Thus, in the semiconductor device A1, malfunctions due to the temperature difference are prevented.

In the method for manufacturing the semiconductor device A1, the paste composite material is applied with a jet dispenser. This enables selective application of the paste composite material, allowing the resin composition 6 to be formed at selected regions. Specifically, it is possible to avoid the element front surface 1a of the semiconductor element 1 during the application of the paste composite material as shown in FIG. 13, which enables formation of the resin composition 6 that does not cover the element front surface 1a as shown in FIG. 4. In this way, it is possible to manufacture the semiconductor device A1 that prevents malfunctions due to the temperature difference described above.

In the semiconductor device A1, the resin composition 6 includes the die-pad-side covering portion 61, and the die-pad-side covering portion 61 covers the bonded region (die-pad-side bonded region) where the conductive bonding material 4 and the lead frame 2 (die pad 24) are bonded. With such a structure, the die-pad-side covering portion 61 improves the bonding strength between the die-pad-side bonded region and the sealing resin 5, preventing detachment between the die-pad-side bonded region and the sealing resin 5. If such a detachment occurs, an increased thermal stress is exerted on the conductive bonding material 4 when a thermal load is exerted on the semiconductor device A1, which may result in cracking of the conductive bonding material 4. Such cracking may deteriorate heat dissipation and electrical conductivity of the conductive bonding material 4. Since the semiconductor device A1 prevents detachment between the die-pad-side bonded region and the sealing resin 5, the thermal stress exerted on the conductive bonding material 4 is reduced, which prevents cracking of the conductive bonding material 4. By preventing cracking of the conductive bonding material 4 in this way, the semiconductor device A1 prevents deterioration of heat dissipation and electrical conductivity of the conductive bonding material 4. It is known that solder containing lead generally has a higher physical strength against thermal stress than lead-free solder. For this reason, conventional semiconductor devices often use solder containing lead for the conductive bonding material 4 to improve resistance to thermal cycles. In the semiconductor device A1, provision of the die-pad-side covering portion 61 (resin composition 6) reduces the thermal stress exerted on the conductive bonding material 4 as described above, so that resistance to thermal cycles is secured even when lead-free solder is used for the conductive bonding material 4. Thus, the semiconductor device A1 provides improved resistance to thermal cycles, with environmental protection taken into consideration.

In the semiconductor device A1, the die-pad-side covering port ion 61 includes the die-pad-side first portion 611 interposed between the connecting surface 4c of the conductive bonding material 4 and the sealing resin 5. With such an arrangement, the bonding strength between the conductive bonding material 4 and the sealing resin 5 is improved by the die-pad-side first portion 611.

Figure 14A:
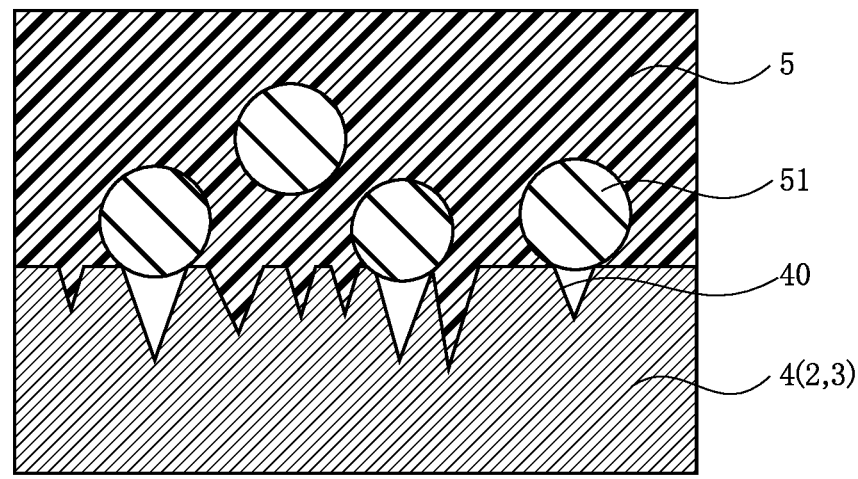
FIG. 14A is a schematic sectional view showing a structure in which sealing resin is directly formed on the conductive bonding material.
Figure 14B:
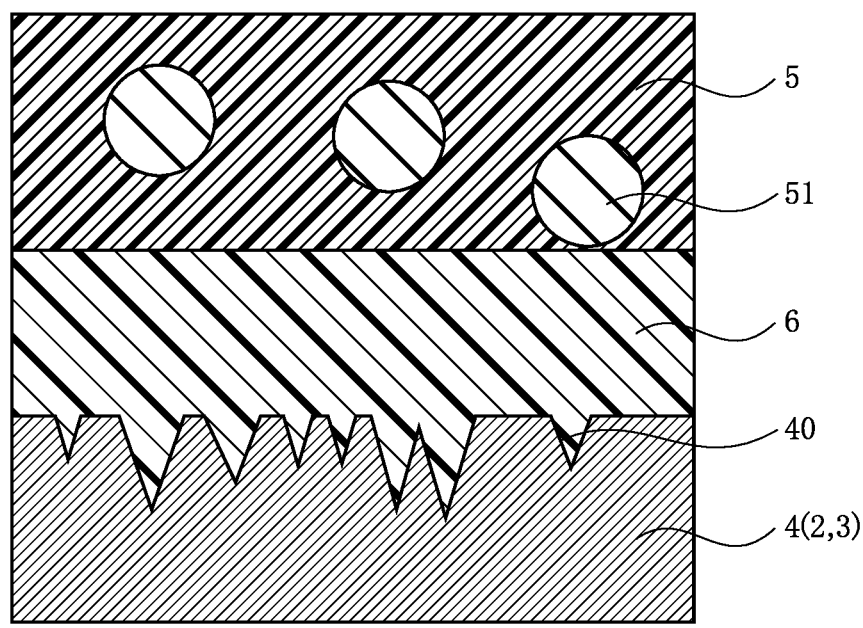
FIG. 14B shows a structure in which a resin composition is interposed between the conductive bonding material and the sealing resin.

FIGS. 14A and 14B are schematic views for explaining the mechanism of how the bonding strength between the conductive bonding material 4 and the sealing resin 5 is improved by the resin composition 6 (die-pad-side first portion 611). FIG. 14A shows a structure in which the sealing resin 5 is directly formed on the conductive bonding material 4, i.e., the structure of a conventional semiconductor device, whereas FIG. 14B shows a structure in which the resin composition 6 is interposed between the conductive bonding material 4 and the sealing resin 5, i.e., the structure of the semiconductor device A1.

As shown in FIG. 14A, the conductive bonding material 4 has a rough surface with fine grooves 40. The grooves 40 are smaller than the particle size of the filler 51 mixed in the sealing resin 5. Thus, when the sealing resin 5 is directly formed on the surface of the conductive bonding material 4, the filler 51 mixed in the sealing resin 5 may close the grooves 40 so that the grooves 40 are not filled with the sealing resin 5. The grooves 40 that are not filled with the sealing resin 5 in this way form air gaps at the interface between the conductive bonding material 4 and the sealing resin 5, which may lead to deterioration of the bonding strength.

In contrast, as shown in FIG. 14B, when the resin composition 6 is interposed between the conductive bonding material 4 and the sealing resin 5, the grooves 40 in the surface of the conductive bonding material 4 are filled with the resin composition 6. In this way, the resin composition 6 prevents formation of air gaps, so that deterioration of the bonding strength due to air gaps is avoided. Further, filling the grooves 40 with the resin composition 6 provides an anchoring effect that improves the bonding strength with the conductive bonding material 4. Moreover, hydrogen bonds are formed at the interface between the resin composition 6 and the sealing resin 5, which provides a good bonding strength between the resin composition 6 and the sealing resin 5. In this way, the bonding strength between the conductive bonding material 4 and the sealing resin 5 is improved by interposing the resin composition 6 between the conductive bonding material 4 and the sealing resin 5.

In the semiconductor device A1, the die-pad-side covering portion 61 includes the die-pad-side second portion 612 interposed between the pad front surface 24a of the die pad 24 and the sealing resin 5. With such an arrangement, the bonding strength between the die pad 24 and the sealing resin 5 is improved by the die-pad-side second portion 612. The surface of the lead frame 2 has fine grooves as with the conductive bonding material 4. Thus, the bonding strength between the die pad 24 and the sealing resin 5 is improved by the same principle as that explained with reference to FIGS. 14A and 14B.

In the semiconductor device A1, the die-pad-side covering portion 61 includes the die-pad-side third portion 613 interposed between each element side surface 1c and the sealing resin 5. With such an arrangement, the bonding strength between the element side surfaces 1c and the sealing resin 5 is improved by the die-pad-side third portion 613. The element side surfaces 1c have fine grooves as with the conductive bonding material 4. Thus, the bonding strength between the element side surfaces 1c and sealing resin 5 is improved by the same principle as that explained with reference to FIGS. 14A and 14B.

In the semiconductor device A1, the resin composition 6 includes the lead-side covering portion 62, and the lead-side covering portion 62 covers the bonded region (lead-side bonded region) where each of the first wires 31 (each of the second bond parts 312) and the lead frame 2 (wire bonding portion 211 of the first lead 21) are bonded. With such an arrangement, the lead-side covering portion 62 improves the bonding strength between the lead-side bonded region and the sealing resin 5, preventing detachment between the lead-side bonded region and the sealing resin 5. If such a detachment occurs, an increased thermal stress is exerted on the second bond part 312 of each first wire 31 when a thermal load is exerted on the semiconductor device A1, which may result in the first wire 31 detaching from the wire bonding portion 211. Since the semiconductor device A1 prevents detachment between the lead-side bonded region and the sealing resin 5, exertion of an increased thermal stress on the second bond part 312 of each first wire 31 is avoided, so that each first wire 31 is prevented from detaching from the wire bonding portion 211. When each first wire 31 is made of metal containing Al, a passivation film (oxide film) is formed on the surface of the first wire 31, protecting the wire from corrosion. However, when detachment between the lead-side bonded region and the sealing resin 5 occurs, the first wire 31 and the sealing resin 5 rub against each other, which may cause damage to the passivation film on the surface of the first wire 31. In such a case, corrosion progresses from the damaged portion of the passivation film, causing deterioration of the electrical conductivity or breakage of the first wire 31. In the semiconductor device A1, however, the lead-side covering portion 62 functions as a protective member to protect the first wires 31 from corrosion, so that deterioration of the electrical conductivity or breakage of the first wires 31 is prevented.

In the semiconductor device A1, the lead-side covering portion 62 includes the lead-side first portion 621 interposed between the second bond part 312 of each first wire 31 and the sealing resin 5. With such an arrangement, the bonding strength between the second bond part 312 and the sealing resin 5 is improved by the lead-side first portion 621.

In the semiconductor device A1, the lead-side covering portion 62 includes the lead-side second portion 622 interposed between the wire bonding portion 211 (first lead 21) and the sealing resin 5. With such an arrangement, the bonding strength between the wire bonding portion 211 (first lead 21) and the sealing resin 5 is improved by the lead-side second portion 622. The surface of the lead frame 2 (first lead 21) has fine grooves as with the conductive bonding material 4. Thus, the bonding strength between the wire bonding portion 211 and the sealing resin 5 is improved by the same principle as that explained with reference to FIGS. 14A and 14B.

In the semiconductor device A1, the lead-side covering portion 62 includes the lead-side third portion 623 interposed between a part of the line part 313 of each first wire 31 and the sealing resin 5. With such an arrangement, the bonding strength between the line part 313 of each first wire 31 and the sealing resin 5 is improved by the lead-side third portion 623.

In the semiconductor device A1, the first wires 31 are made of metal containing Al, whereas the first lead 21 is made of metal containing Cu. The first wires 31 are bonded to the first lead 21 (wire bonding portion 211). When such different types of metals are bonded, the difference in coefficient of thermal expansion (coefficient of linear thermal expansion) causes a larger thermal stress to be exerted on the first wires 31 (second bond part 312) than when the same type of metals are bonded, so that detachment between the lead-side bonded region and the sealing resin 5 is more likely to occur. Accordingly, in order to prevent the detachment between the lead-side bonded region and the sealing resin 5, the provision of the resin composition 6 including the lead-side covering portion 62 is more effective when the first wires 31 and the first lead 21 are made of different types of metals, as compared with when the first wires 31 and the first lead 21 are made of the same type of metal.

In the semiconductor device A1, the pad back surface 24b of the die pad 24 is exposed from the sealing resin 5. Such exposure of the die pad 24 from the sealing resin 5 causes the die pad 24 to undergo a greater thermal expansion than when there is no exposure. As a result, an increased thermal stress is exerted on the die-pad-side bonded region, so that the sealing resin 5 is more likely to be detached at the die-pad-side bonded region. Accordingly, the provision of the die-pad-side covering portion 61 to prevent the detachment of the sealing resin 5 due to thermal stress on the die-pad-side bonded region is particularly effective for the semiconductor device A1 in which the pad back surface 24b of the die pad 24 is exposed from the sealing resin 5.

In the semiconductor device A1, the semiconductor element 1 is a power semiconductor chip such as a MOSFET. Power semiconductor chips have relatively high resistance to large currents and voltages, but generate a large amount of heat. Such heat generation can cause the above-described detachment of the sealing resin 5. Thus, the provision of the resin composition 6 to prevent the detachment of the sealing resin 5 is particularly effective for the semiconductor device A1 in which a power semiconductor chip is mounted as the semiconductor element 1.

The first embodiment shows the example in which the resin composition 6 includes both the die-pad-side covering portion 61 and the lead-side covering portion 62, but either one alone may suffice. For example, when the resin composition 6 includes the die-pad-side covering portion 61 alone, the presence of the resin composition 6 (die-pad-side covering portion 61) between the die-pad-side bonded region and the sealing resin 5 improves the bonding strength between the die-pad-side bonded region and the sealing resin 5. In this case, the step of applying the paste composite material (application step) may be performed before the step of bonding the first wires 31, the second wire 32 and the third wire 33. On the other hand, when the resin composition 6 includes the lead-side covering portion 62 alone, the presence of the resin composition 6 (lead-side covering portion 62) between the lead-side bonded region and the sealing resin 5 improves the bonding strength between the lead-side bonded region and the sealing resin 5. When the resin composition 6 is formed to include only one of the die-pad-side covering portion 61 and the lead-side covering portion 62 in this way, the manufacturing cost and the manufacturing steps are reduced because forming the other one is not necessary.

The first embodiment shows the example in which the lead-side covering portion 62 of the resin composition 6 covers the bonded region of the first wires 31 and the first lead 21, but the present disclosure is not limited to this. For example, a resin composition 6 covering the bonded region of the second wire 32 and the second lead 22 may be provided instead of or in addition to the lead-side covering portion 62. Such an arrangement prevents detachment of the sealing resin 5 from the bonded region of the second wire 32 and the second lead 22. Also, a resin composition 6 covering the bonded region of the third wire 33 and the third lead 23 may be provided instead of or in addition to the lead-side covering portion 62. Such an arrangement prevents detachment of the sealing resin 5 from the bonded region of the third wire 33 and the third lead 23.

FIGS. 15-31 show other embodiments of a semiconductor device and its manufacturing method according to the present disclosure. In these figures, the elements that are identical or similar to those of the semiconductor device A1 of the first embodiment are denoted by the same reference signs as those used for the semiconductor device A1, and the description thereof is omitted.

Figure 15:
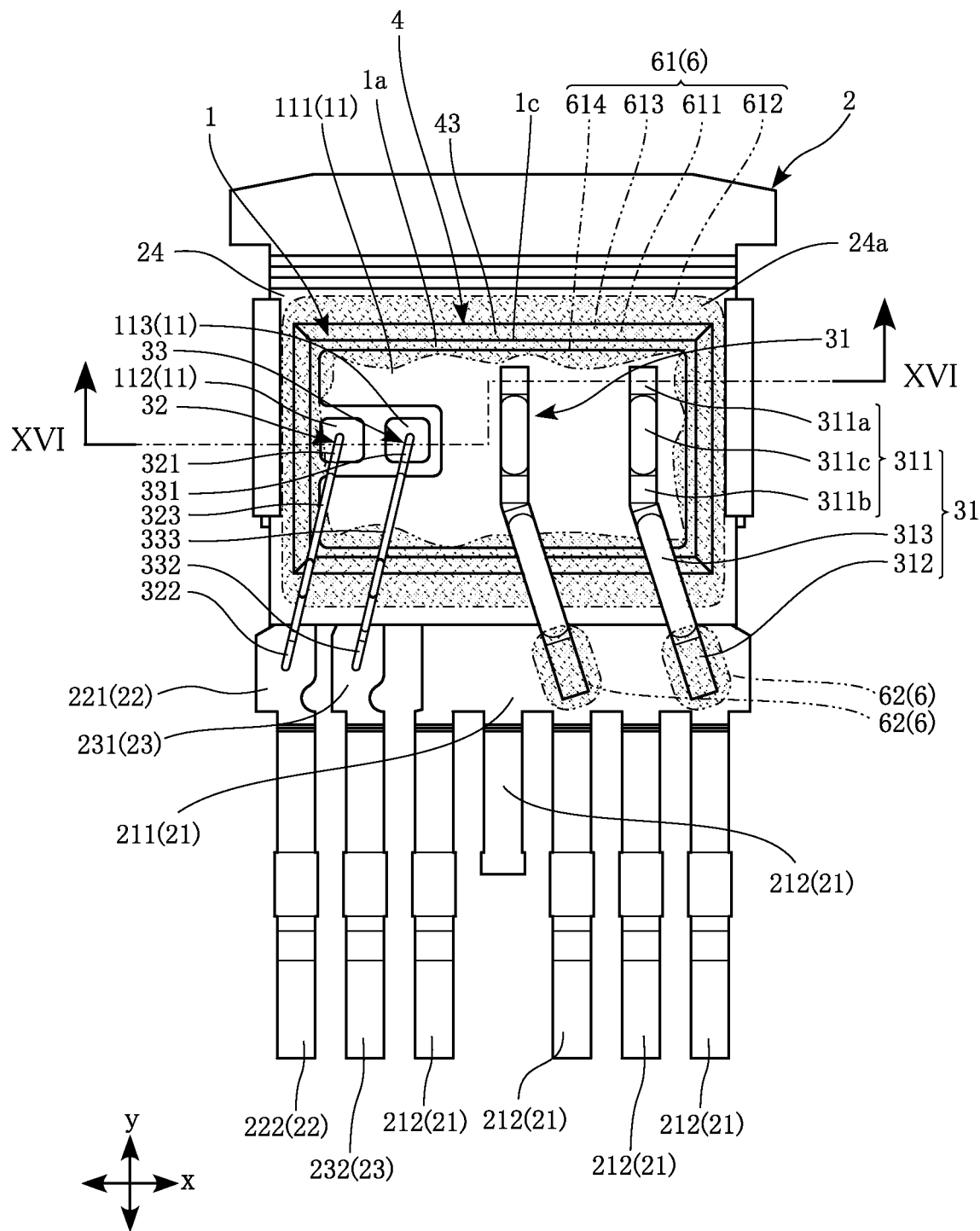
FIG. 15 is a plan view showing a semiconductor device according to a second embodiment (with the sealing resin omitted)
Figure 16:
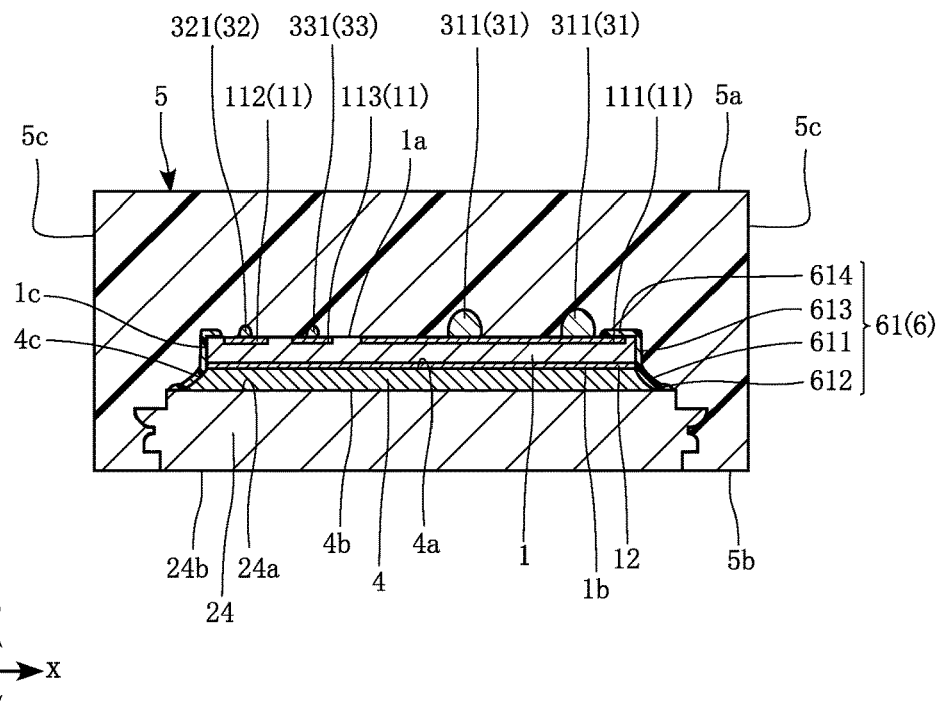
FIG. 16 is a sectional view showing the semiconductor device according to the second embodiment.

FIGS. 15 and 16 show a semiconductor device according to a second embodiment. The semiconductor device A2 of the second embodiment differs from the semiconductor device A1 in formation region of the resin composition 6.

Specifically, as shown in FIGS. 15 and 16, in the resin composition 6 of the semiconductor device A2, the die-pad-side covering portion 61 further includes a die-pad-side fourth portion 614. FIG. 15 is a plan view showing the semiconductor device A2 and corresponds to FIG. 4 of the first embodiment. FIG. 16 is a sectional view taken along line XVI-XVI in FIG. 15.

As shown in FIGS. 15 and 16, the die-pad-side fourth portion 614 covers part of the element front surface 1a. The die-pad-side fourth portion 614 is interposed between the part of the element front surface 1a and the sealing resin 5. As shown in FIGS. 15 and 16, the die-pad-side fourth portion 614 is connected to the die-pad-side third portion 613. In a step of manufacturing the semiconductor device A2 (application step), the paste composite material that will become the resin composition 6 is applied using a jet dispenser, for example. In applying the paste composite material, part of the paste composite material may be put on the element front surface 1a. The die-pad-side fourth portion 614 may be formed of this part of the paste composite material applied to the element front surface 1a.

The semiconductor device A2 includes the resin composition 6, as with the semiconductor device A1. The resin composition 6 covers the bonded region (e.g., the die-pad-side bonded region or the lead-side bonded region) where the conductive members (e.g., the conductive bonding material 4 or the first wires 31) and the lead frame 2 are bonded. Thus, in the semiconductor device A2 again, malfunctions due to detachment of the sealing resin 5 are prevented, as with the semiconductor device A1.

The second embodiment shows the example in which the first bond part 311 of each first wire 31, the first bond part 321 of the second wire 32 and the first bond part 331 of the third wire 33 are exposed from the die-pad-side covering portion 61 (resin composition 6), but the present disclosure is not limited to this. For example, part or the entirety of these bond parts may be covered with the die-pad-side covering portion 61 (resin composition 6). However, since source current flows through each first wire 31, the first wires 31 tend to have a higher temperature than the second wire 32 and the third wire 33. Thus, the first wires 31 are more likely to be adversely affected by thermal load than are the second wire 32 and the third wire 33. Thus, to prevent such adverse effects of thermal load on the first wires 31, it is desirable to expose at least the first bond part 331 of each first wire 31 from the die-pad-side covering portion 61 (resin composition 6).

The second embodiment shows the example in which the die-pad-side fourth portion 614 covers part of the element front surface 1a, but the present disclosure is not limited to this. For example, the die-pad-side fourth portion 614 may cover the entirety of the element front surface 1a. However, considering that covering the entirety of the element front surface 1a with the die-pad-side fourth portion 614 increases the temperature difference at the interface of the element front surface 1a as described before, it is preferable that the die-pad-side fourth portion 614 covers only a part of the element front surface 1a, rather than the entirety of the element front surface 1a.

FIGS. 17-24 show a semiconductor device according to a third embodiment. The semiconductor device A3 of the third embodiment differs from the semiconductor device A1 in that it is not provided with a source sense terminal.

Figure 17:
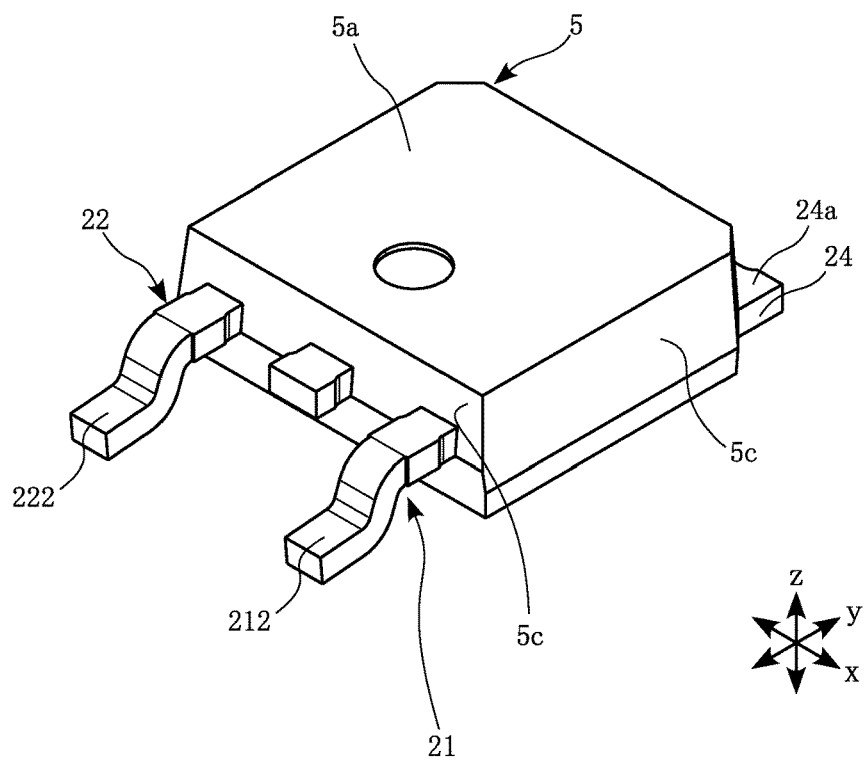
FIG. 17 is a perspective view showing a semiconductor device according to a third embodiment.
Figure 18:
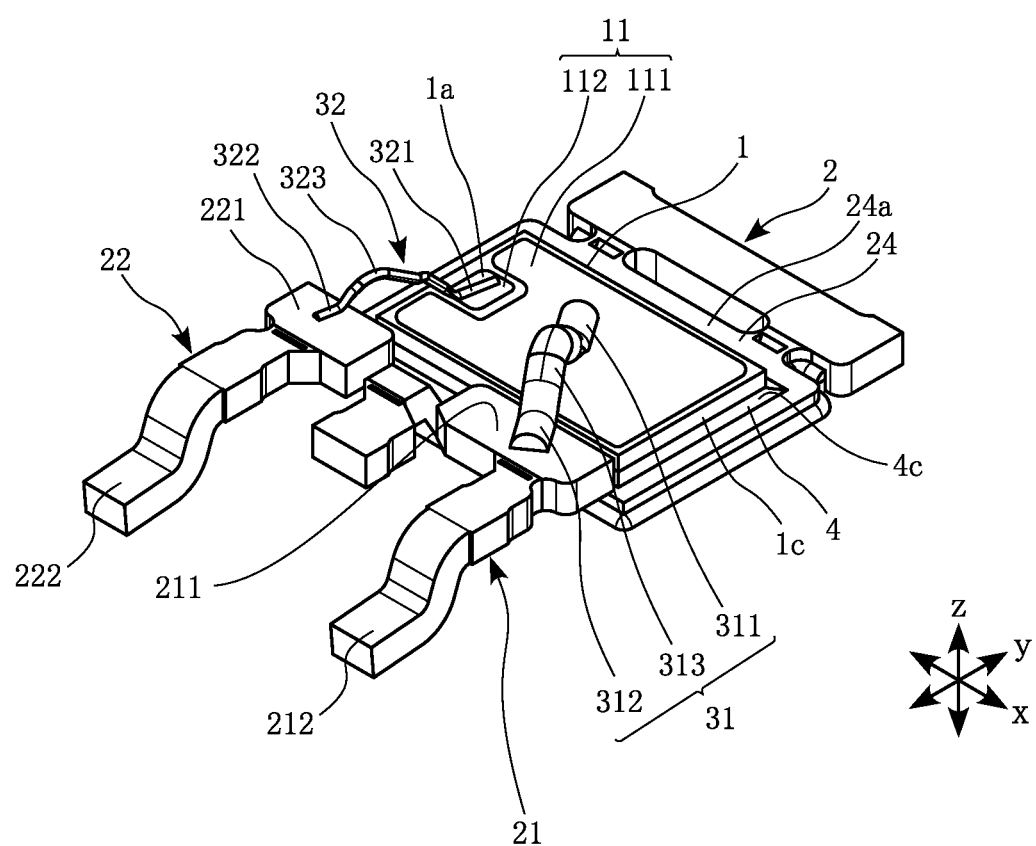
FIG. 18 is a perspective view corresponding to FIG. 17, with a sealing resin and a resin composition omitted.
Figure 19:
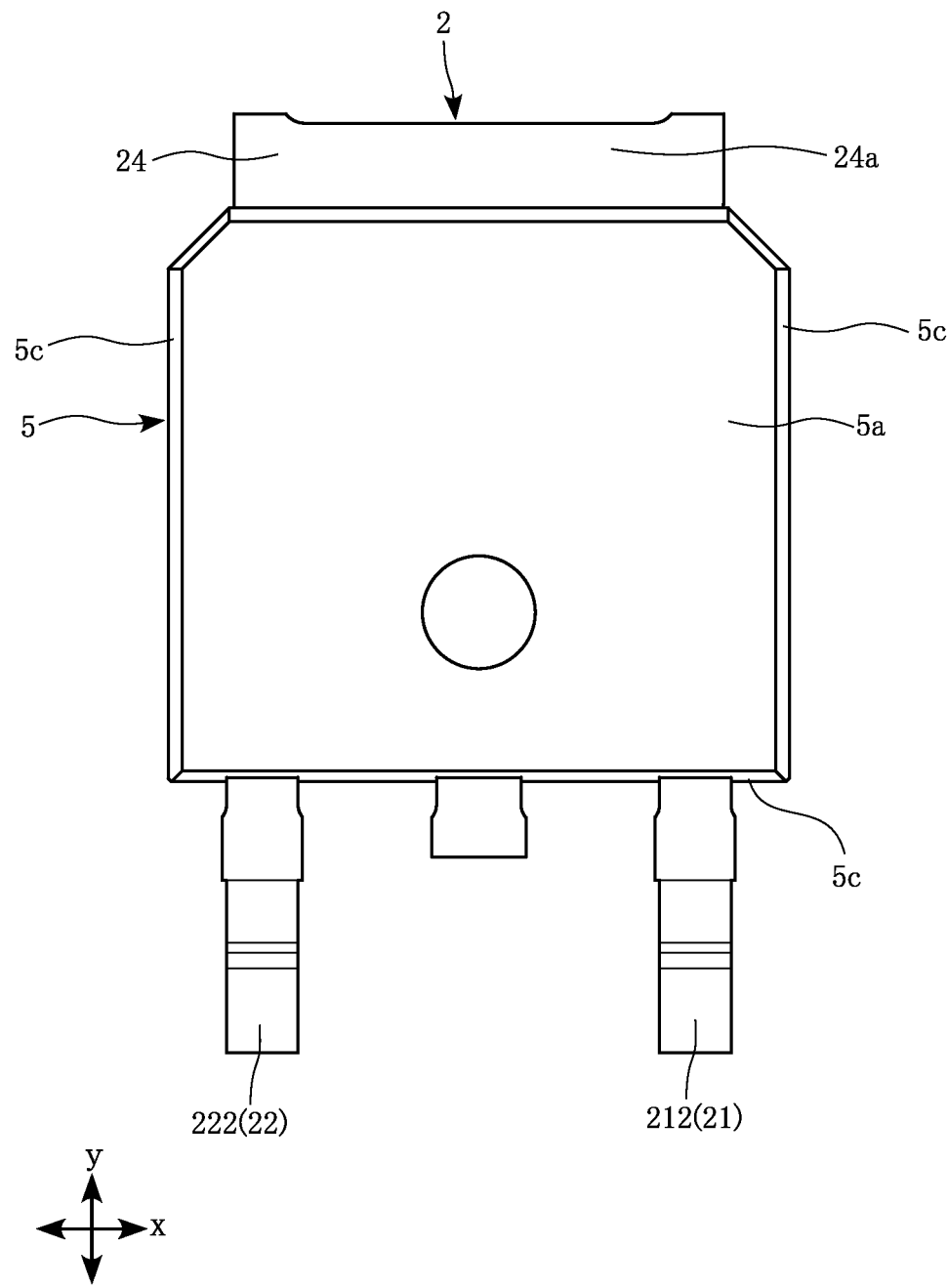
FIG. 19 is a plan view showing the semiconductor device according to the third embodiment.
Figure 20:
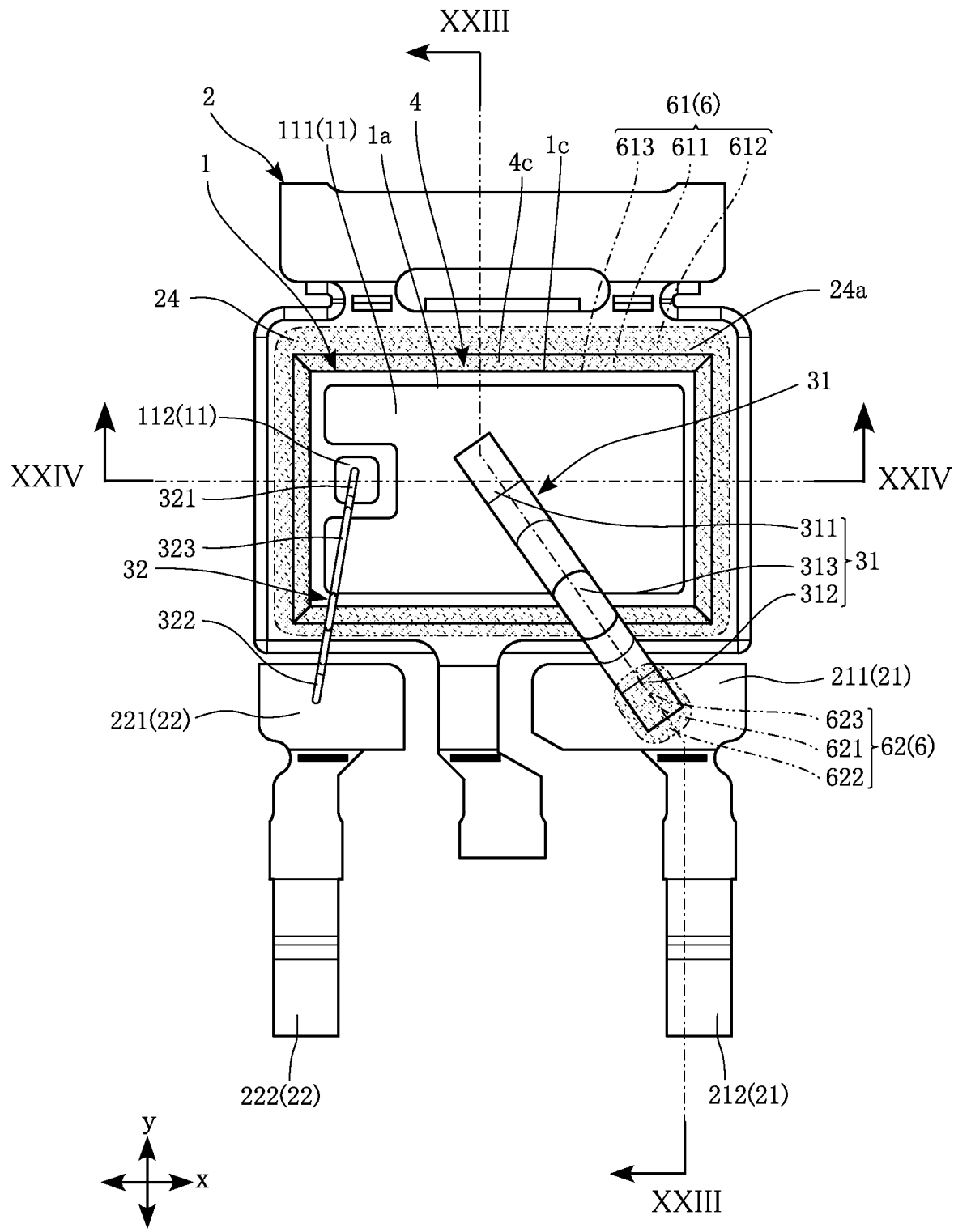
FIG. 20 is a plan view obtained by omitting the sealing resin from FIG. 19.
Figure 21:
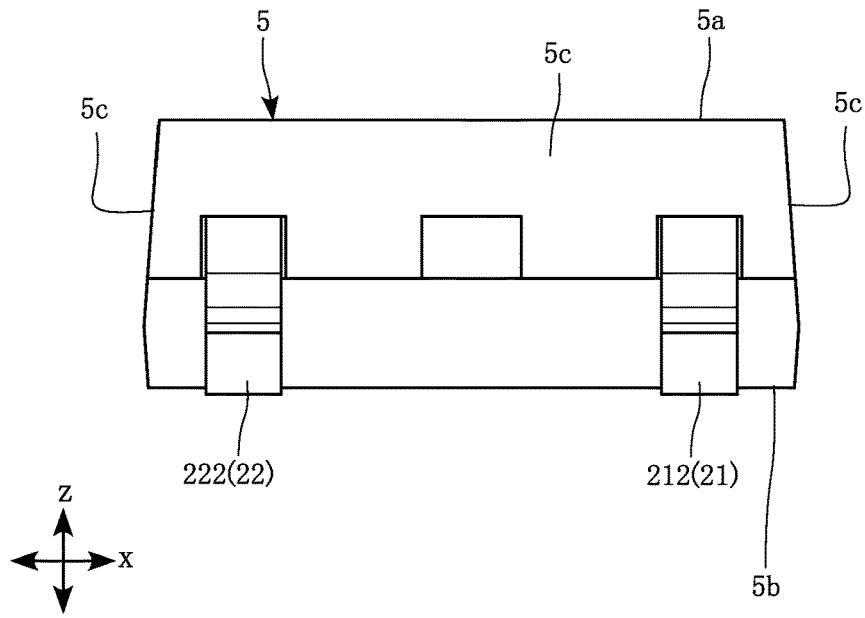
FIG. 21 is a front view showing the semiconductor device according to the third embodiment.
Figure 22:
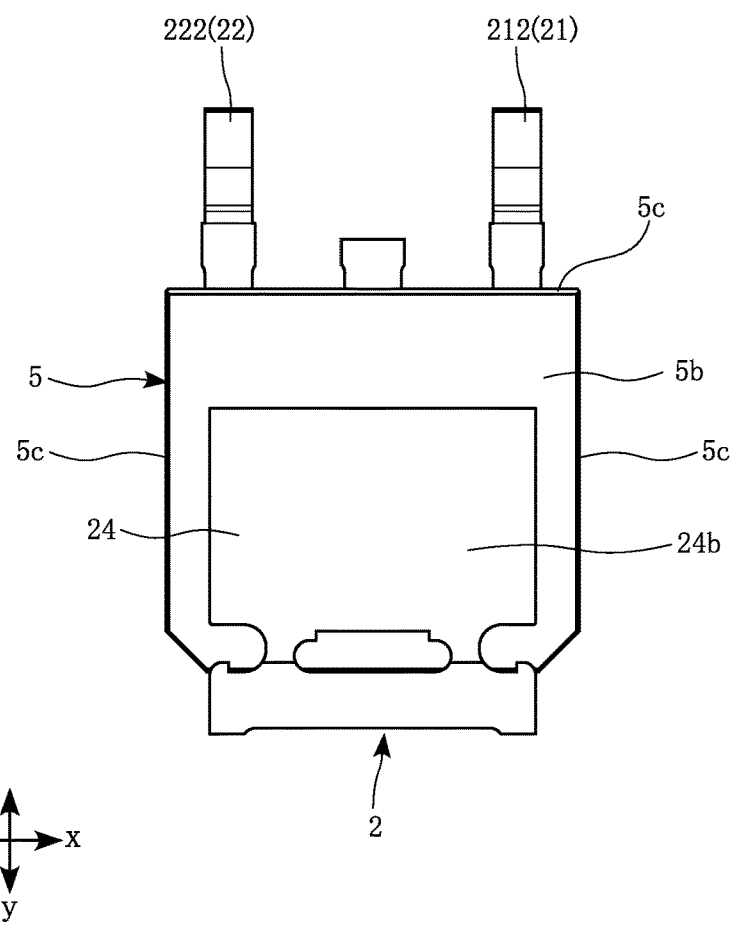
FIG. 22 is a bottom view showing the semiconductor device according to the third embodiment.
Figure 23:
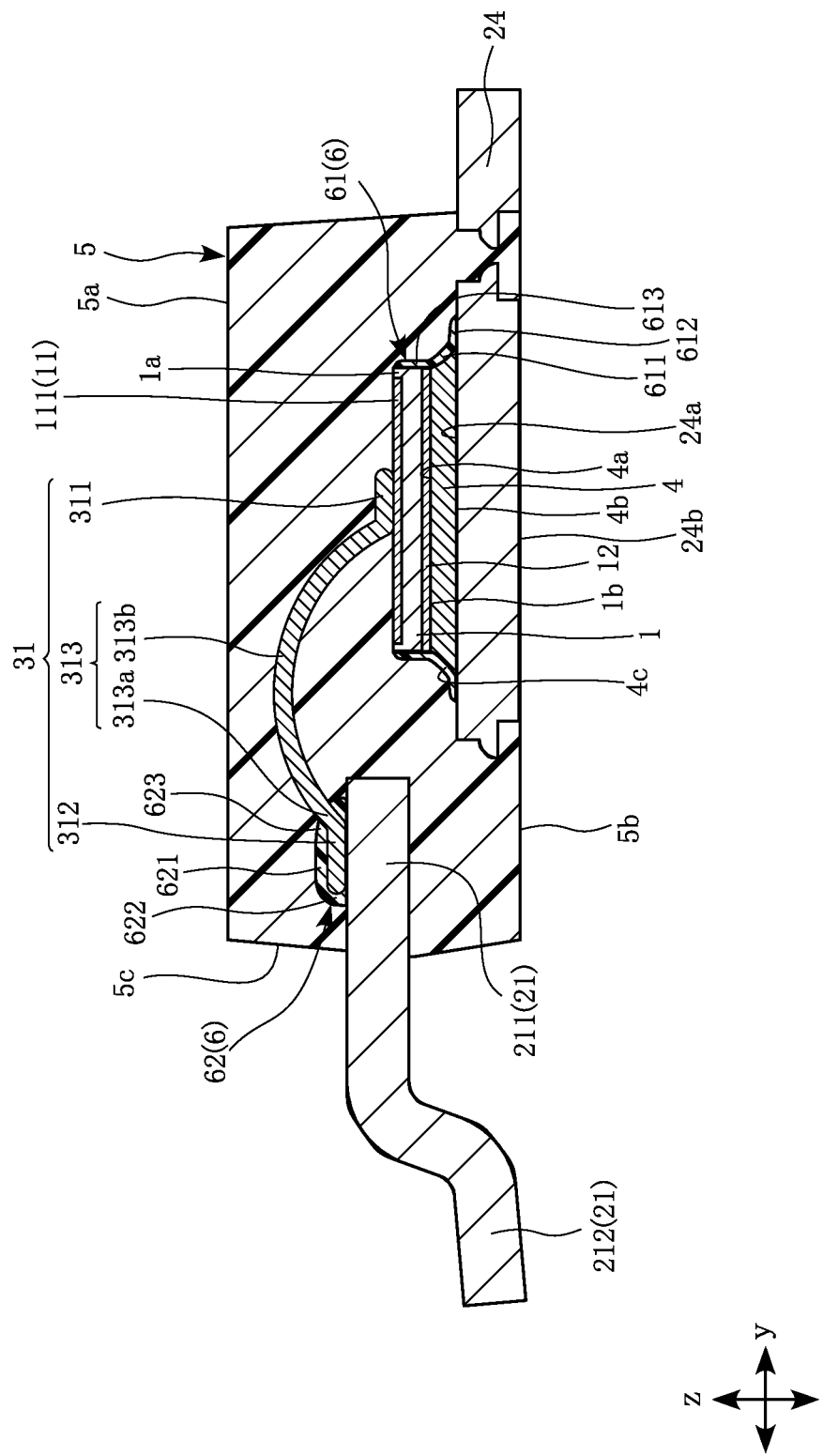
FIG. 23 is a sectional view taken along line XXIII-XXIII in FIG. 20.
Figure 24:
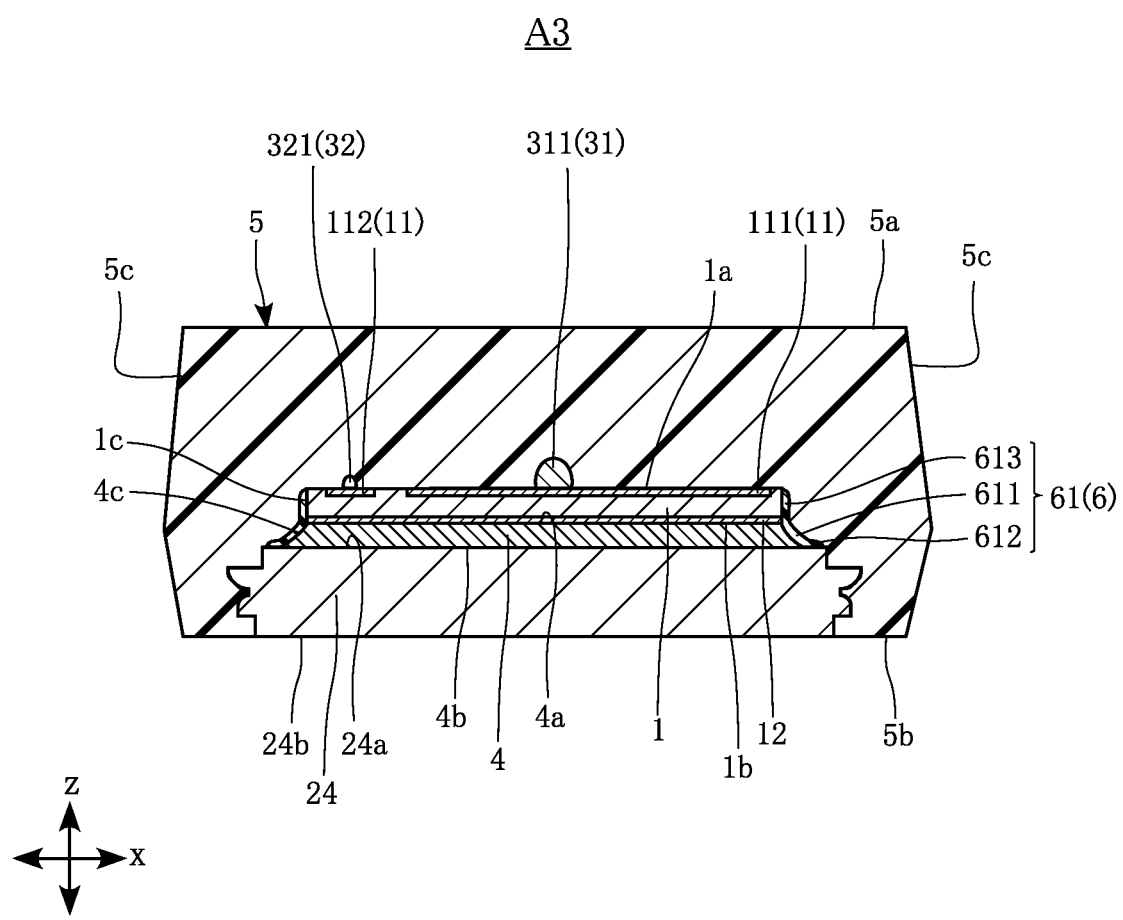
FIG. 24 is a sectional view taken along line XXIV-XXIV in FIG. 20.

FIG. 17 is a perspective view of the semiconductor device A3. FIG. 18 is a perspective view corresponding to FIG. 17, with the sealing resin 5 and the resin composition 6 omitted. FIG. 19 is a plan view of the semiconductor device A3. FIG. 20 is a plan view obtained by omitting the sealing resin 5 from FIG. 19. Note that in FIG. 20 the resin composition 6 is indicated by imaginary lines (and applied with dot patterns for the convenience of understanding). FIG. 21 is a front view of the semiconductor device A3. FIG. 22 is a bottom view of the semiconductor device A3. FIG. 23 is a sectional view taken along line XXIII-XXIII in FIG. 20. FIG. 24 is a sectional view taken along line XXIV-XXIV in FIG. 20.

In the semiconductor device A3, the semiconductor element 1 has a first front-surface electrode 111 and a second front-surface electrode 112 as the front-surface electrode 11, as shown in FIGS. 18, 20 and 24. Unlike the semiconductor element 1 of the first embodiment, the semiconductor element 1 of this embodiment does not have a third front-surface electrode 113. Accordingly, the semiconductor device A3 does not have a third wire 33 and a third lead 23 for electrically connecting a third front-surface electrode 113 to the outside of the semiconductor device.

In the semiconductor device A3, the first lead 21 does not include a plurality of terminal portions 212 but includes a single terminal portions 212. The number of terminal portions 212 in the semiconductor device A3 is not limited. As shown in FIGS. 17-22, in the semiconductor device A3, the die pad 24 includes a portion projecting from the sealing resin 5 between the terminal portion 212 and the terminal portion 222. The projecting portion may be shorter than the terminal portions 212 and 222 as shown in FIGS. 17-22, or may have the same shape as the terminal portions 212 and 222.

In the semiconductor device A3, the bonded region (the die-pad-side bonded region or the lead-side bonded region) where the conductive members (the conductive bonding material 4 or the first wires 31) and the lead frame 2 are bonded is covered with the resin composition 6. Thus, in the semiconductor device A3 again, malfunctions due to detachment of the sealing resin 5 are prevented, as with the semiconductor device A1.

Figure 25:
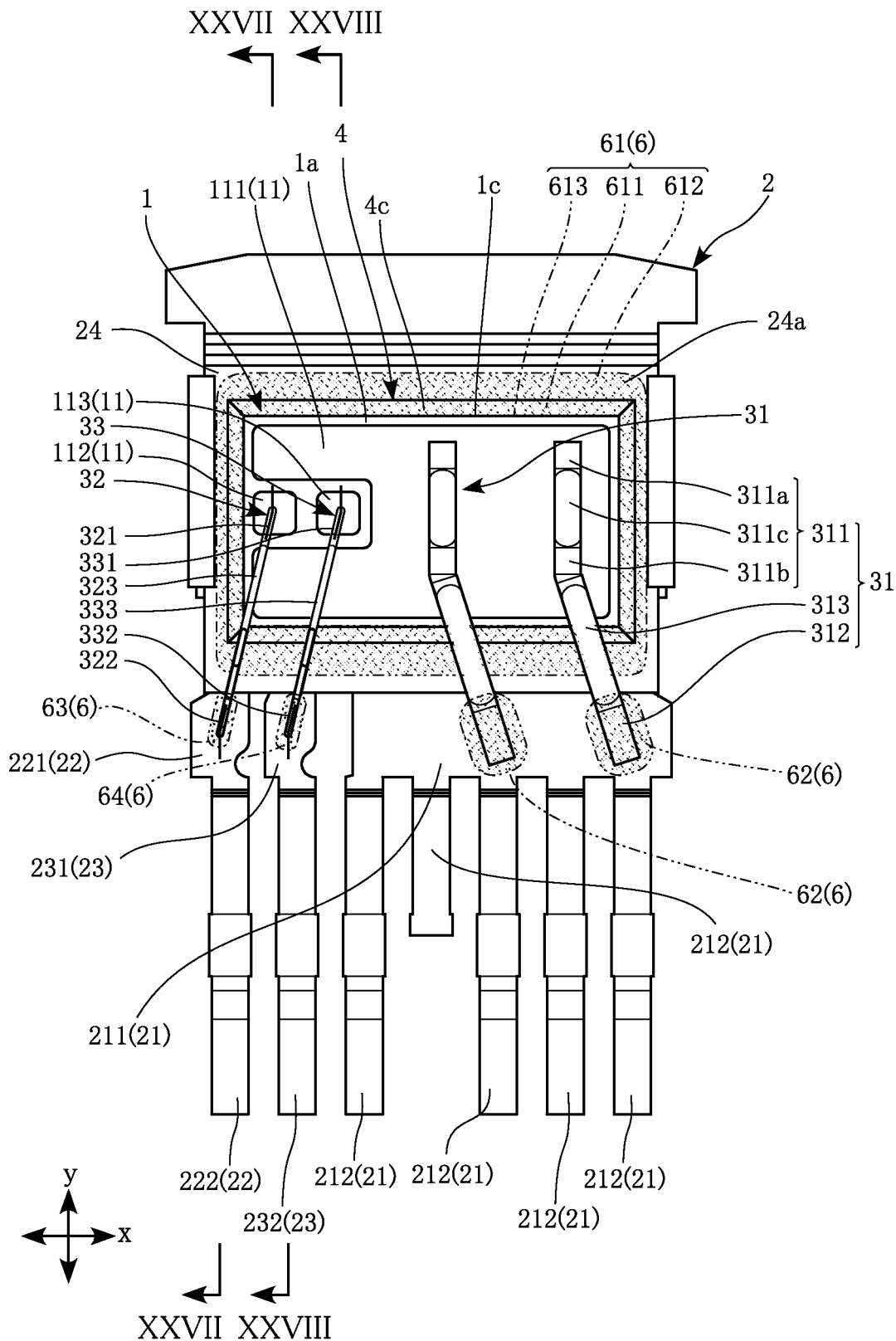
FIG. 25 is a plan view showing a semiconductor device according to a fourth embodiment.
Figure 26:
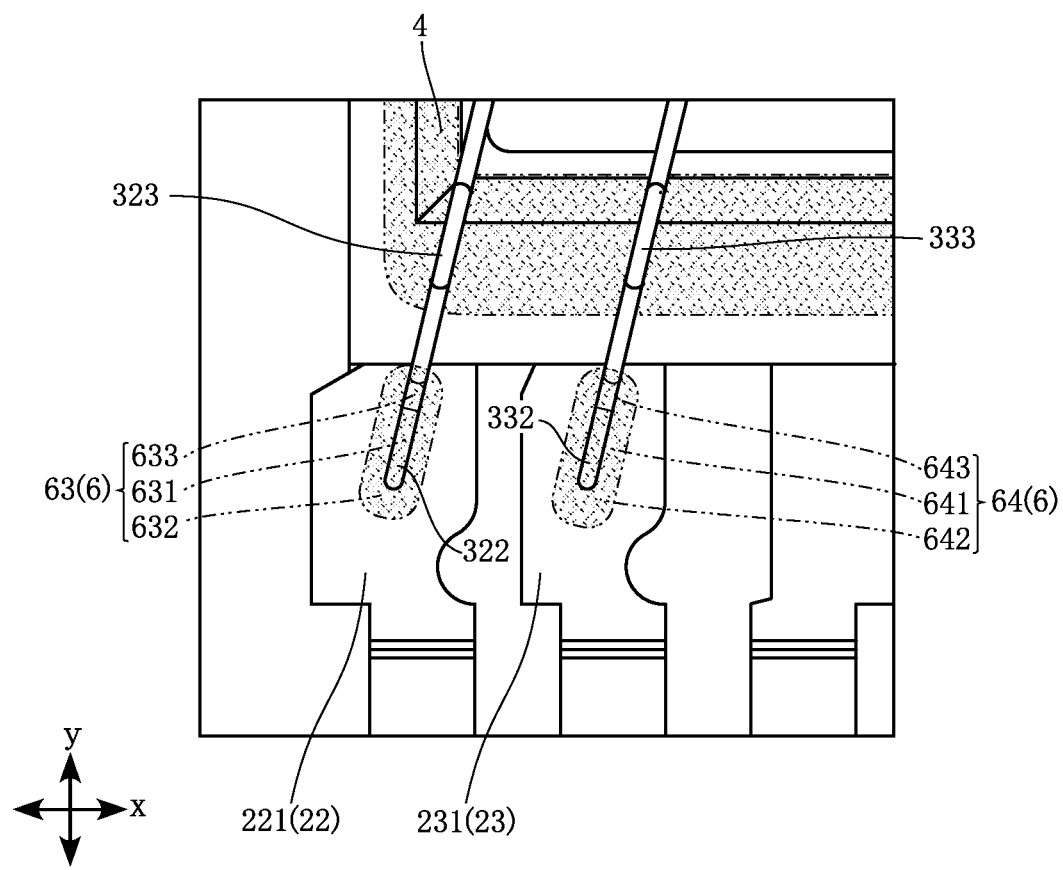
FIG. 26 is a partially enlarged view of FIG. 25.
Figure 27:
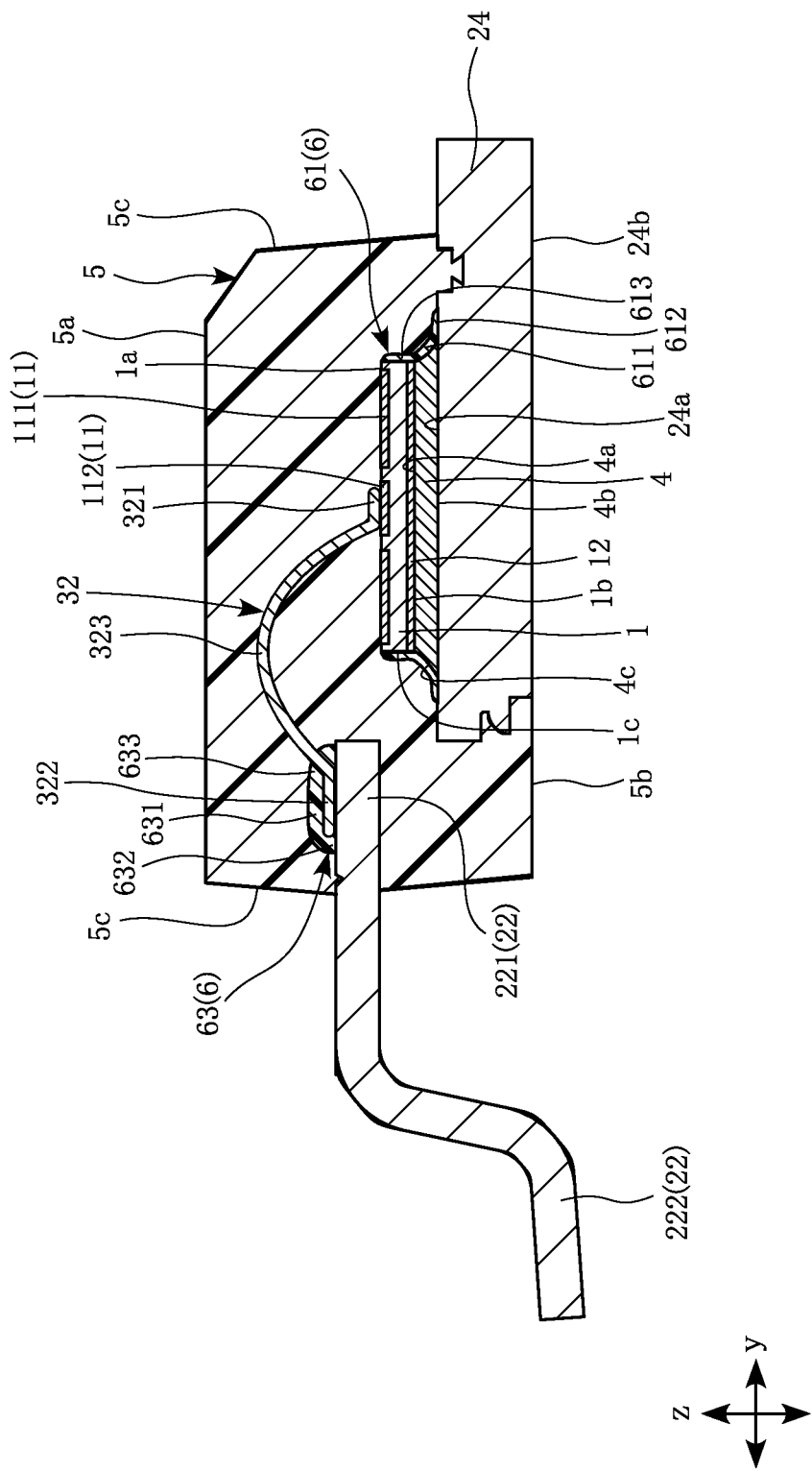
FIG. 27 is a sectional view taken along line XXVII-XXVII in FIG. 25.
Figure 28:
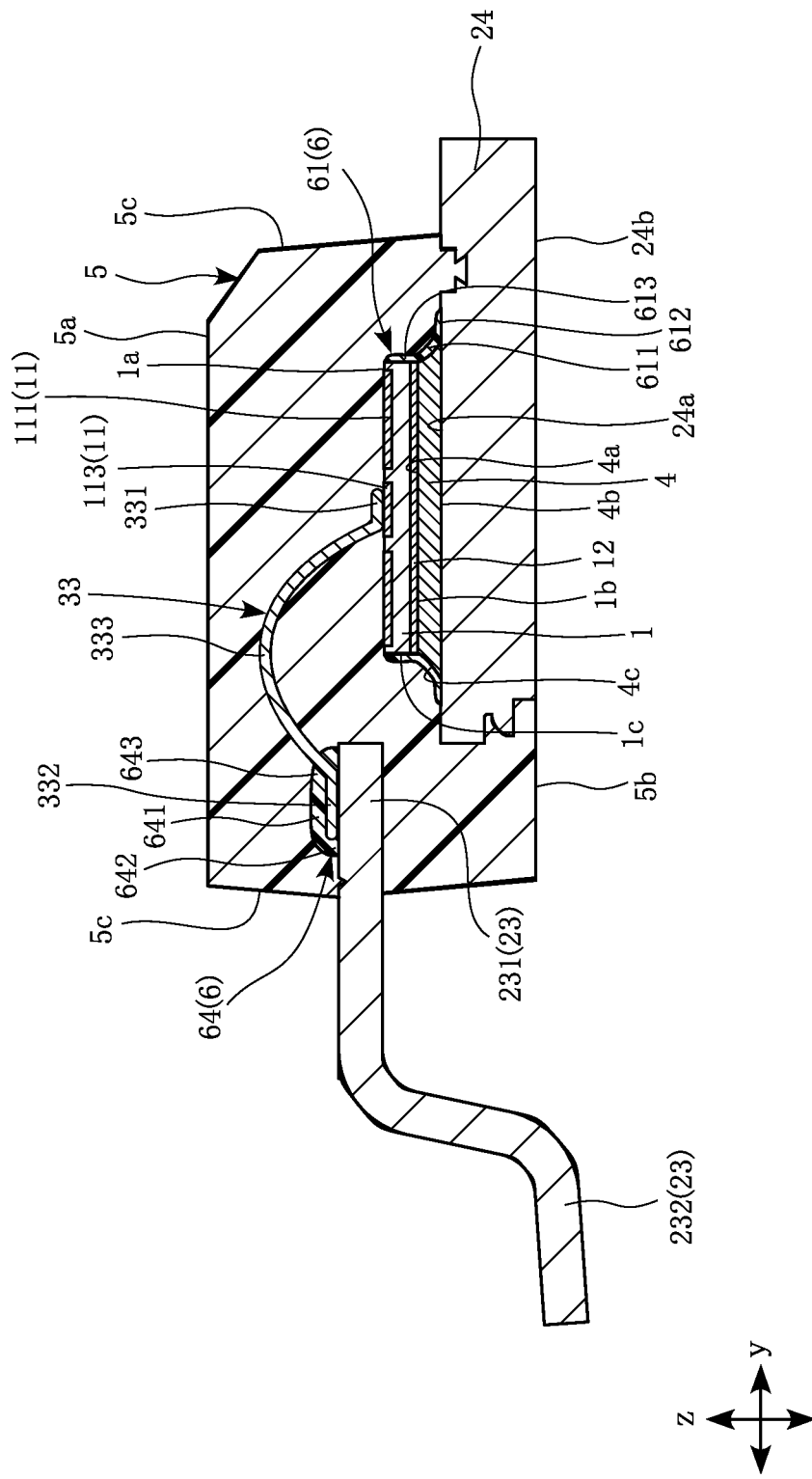
FIG. 28 is a sectional view taken along line XXVIII-XXVIII in FIG. 25.

FIGS. 25-28 show a semiconductor device according to a fourth embodiment. The semiconductor device A4 of the fourth embodiment differs from the semiconductor device A1 in formation region of the resin composition 6. Specifically, the resin composition 6 of the semiconductor device A4 further includes a lead-side covering portion 63 and a lead-side covering portion 64. FIG. 25 is a plan view showing the semiconductor device A4 and corresponds to FIG. 4 of the first embodiment. FIG. 26 is a partially enlarged view showing a part of FIG. 25. FIG. 27 is a sectional view taken along line XXVII-XXVII in FIG. 25. FIG. 28 is a sectional view taken along line XXVIII-XXVIII in FIG. 25.

In the semiconductor device A4, the second wire 32 and the third wire 33 are both bonding wires containing Al. The diameter of the second wire 32 and the third wire 33 is e.g. about 125 μm.

As shown in FIGS. 25, 26 and 27, the lead-side covering portion 63 covers the bonded region where the second wire 32 and the second lead 22 are bonded. As shown in FIGS. 26 and 27, the lead-side covering portion 63 includes a lead-side first portion 631, a lead-side second portion 632 and a lead-side third portion 633. The lead-side first portion 631, the lead-side second portion 632 and the lead-side third portion 633 are integrally formed.

As shown in FIGS. 26 and 27, the lead-side first portion 631 is interposed between the second bond part 322 of the second wire 32 and the sealing resin 5.

As shown in FIGS. 26 and 27, the lead-side second portion 632 is interposed between the wire bonding portion 221 of the second lead 22 and the sealing resin 5. The lead-side second portion 632 is connected to the lead-side first portion 631.

As shown in FIGS. 26 and 27, the lead-side third portion 633 is interposed between a part of the line part 323 of the second wire 32 and the sealing resins. Specifically, the lead-side third portion 633 is formed on a part of the line part 323 that is offset toward the second bond part 322. The lead-side third portion 633 is connected to the lead-side first portion 631.

As shown in FIGS. 25, 26 and 28, the lead-side covering portion 64 covers the bonded region where the third wire 33 and the third lead 23 are bonded. As shown in FIGS. 26 and 28, the lead-side covering portion 64 includes a lead-side first portion 641, a lead-side second portion 642 and a lead-side third portion 643. The lead-side first portion 641, the lead-side second portion 642 and the lead-side third portion 643 are integrally formed.

As shown in FIGS. 26 and 28, the lead-side first portion 641 is interposed between the second bond part 332 of the third wire 33 and the sealing resin 5.

As shown in FIGS. 26 and 28, the lead-side second portion 642 is interposed between the wire bonding portion 231 of the third lead 23 and the sealing resin 5. The lead-side second portion 642 is connected to the lead-side first portion 641.

As shown in FIGS. 26 and 28, the lead-side third portion 643 is interposed between a part of the line part 333 of the third wire 33 and the sealing resins. Specifically, the lead-side third portion 643 is formed on a part of the line part 333 that is offset toward the second bond part 332. The lead-side third portion 643 is connected to the lead-side first portion 641.

The semiconductor device A4 includes the resin composition 6, as with the semiconductor device A1. The resin composition 6 covers the bonded region (the die-pad-side bonded region or the lead-side bonded region) where the conductive members (e.g., the conductive bonding material 4 or the first wires 31) and the lead frame 2 are bonded. Thus, in the semiconductor device A4 again, malfunctions due to detachment of the sealing resin 5 are prevented, as with the semiconductor device A1.

In the semiconductor device A4, the resin composition 6 includes the lead-side covering portion 63, and the lead-side covering portion 63 covers the bonded region of the second wire 32 and the second lead 22. With such an arrangement, the resin composition 6 serves as an adhesive to improve the bonding strength between the sealing resin 5 and the bonded region of the second wire 32 and the second lead 22. Thus, the semiconductor device A4 prevents detachment between the bonded region and the sealing resin 5. If such a detachment occurs, a thermal stress is exerted on a neck portion of the second wire 32 (i.e., the portion connecting the second bond part 322 and the line part 323) when a thermal load is exerted on the semiconductor device A4, which may result in breakage of the neck portion. Since the semiconductor device A4 prevents detachment between the sealing resin 5 and the bonded region of the second wire 32 and the second lead 22, thermal stress exerted on the neck portion is reduced. Thus, the semiconductor device A4 prevents malfunctions (e.g., breakage of the second wire 32) due to detachment of the sealing resin 5. In particular, in the semiconductor device A4, a large thermal stress can be exerted on the neck portion, because the second wire 32 is made of metal containing A1 whereas the second lead 22 is made of metal containing Cu. Thus, the provision of the lead-side covering portion 63 to reduce the thermal stress on the neck portion is effective for preventing malfunctions of the semiconductor device A4.

In the semiconductor device A4, the second wire 32 is thinner than each of the first wires 31. Thus, the second wire 32 is more likely to break due to corrosion than the first wires. However, since the resin composition 6 of the semiconductor device A4 includes the lead-side covering portion 63 and the lead-side covering portion 63 functions as a protective member, corrosion of the second wire 32 (e.g., at the portion (neck portion) connecting the second bond part 322 and the line part 323) is prevented. Thus, the semiconductor device A4 prevents breakage of the second wire 32 due to corrosion.

In the semiconductor device A4, the resin composition 6 includes the lead-side covering portion 64, and the lead-side covering portion 64 covers the bonded region of the third wire 33 and the third lead 23. With such an arrangement, the resin composition 6 serves as an adhesive to improve the bonding strength between the sealing resin 5 and the bonded region of the third wire 33 and the third lead 23. Thus, the semiconductor device A4 prevents detachment between the bonded region and the sealing resin 5. If such a detachment occurs, a thermal stress is exerted on a neck portion of the third wire 33 (i.e., the portion connecting the second bond part 332 and the line part 333) when a thermal load is exerted on the semiconductor device A4, which may result in breakage of the neck portion. Since the semiconductor device A4 prevents detachment between the sealing resin 5 and the bonded region of the third wire 33 and the third lead 23, thermal stress exerted on the neck portion is reduced. Thus, the semiconductor device A4 prevents malfunctions (e.g., breakage of the third wire 33) due to detachment of the sealing resin 5. In particular, in the semiconductor device A4, a large thermal stress can be exerted on the neck portion, because the third wire 33 is made of metal containing A1 whereas the third lead 23 is made of metal containing Cu. Thus, the provision of the lead-side covering portion 64 to reduce the thermal stress on the neck portion is effective for preventing malfunctions of the semiconductor device A4.

In the semiconductor device A4, the third wire 33 is thinner than each of the first wires 31. Thus, the third wire 33 is more likely to break due to corrosion than the first wires. However, since the resin composition 6 of the semiconductor device A4 includes the lead-side covering portion 64 and the lead-side covering portion 64 functions as a protective member, corrosion of the third wire 33 (e.g., at the portion (neck portion) connecting the second bond part 332 and the line part 333) is prevented. Thus, the semiconductor device A4 prevents breakage of the third wire 33 due to corrosion.

The fourth embodiment shows the example in which the second wire 32 and the third wire 33 are both made of metal containing A1, but the present disclosure is not limited to this. For example, the second wire 32 may be made of metal containing Cu or metal containing Au. In such a case again, the lead-side covering portion 63 serves as an adhesive to improve the bonding strength between the sealing resin 5 and the bonded region of the second wire 32 and the second lead 22. Also, the third wire 33 may be made of metal containing Cu or metal containing Au. In such a case again, the lead-side covering portion 64 serves as an adhesive to improve the bonding strength between the sealing resin 5 and the bonded region of the third wire 33 and the third lead 23.

Figure 29:
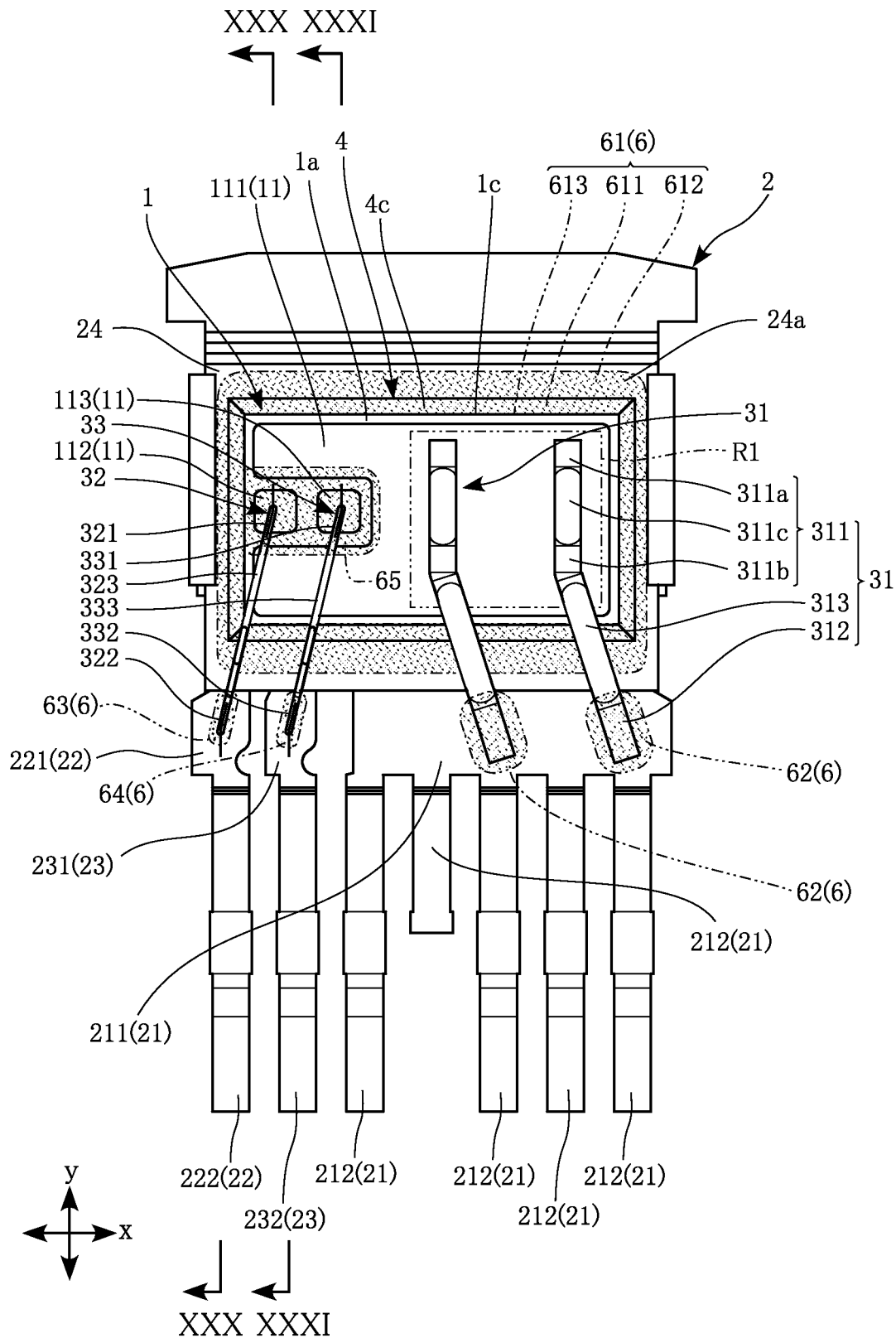
FIG. 29 is a plan view showing a semiconductor device according to a fifth embodiment.
Figure 30:
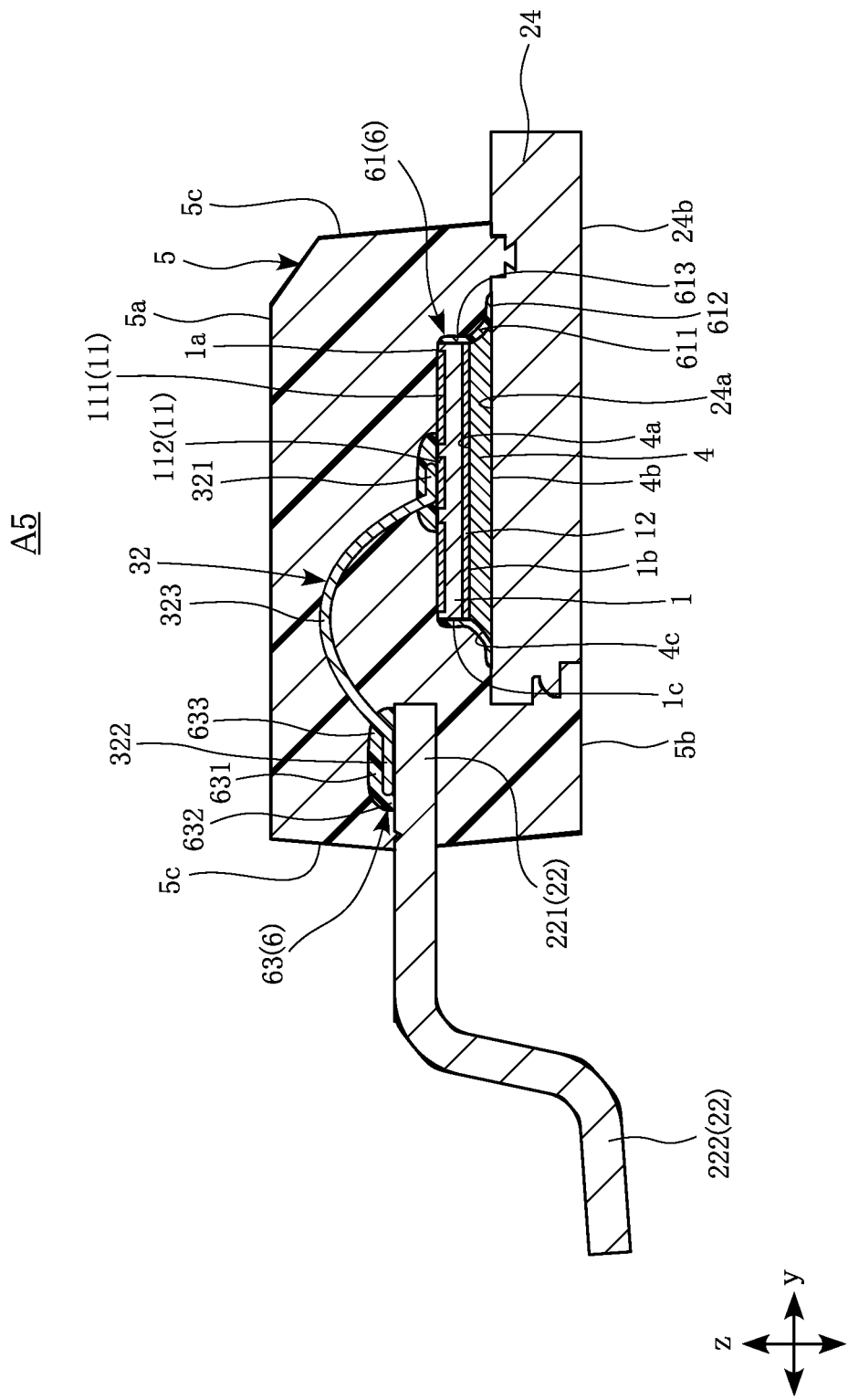
FIG. 30 is a sectional view taken along line XXX-XXX in FIG. 29.
Figure 31:
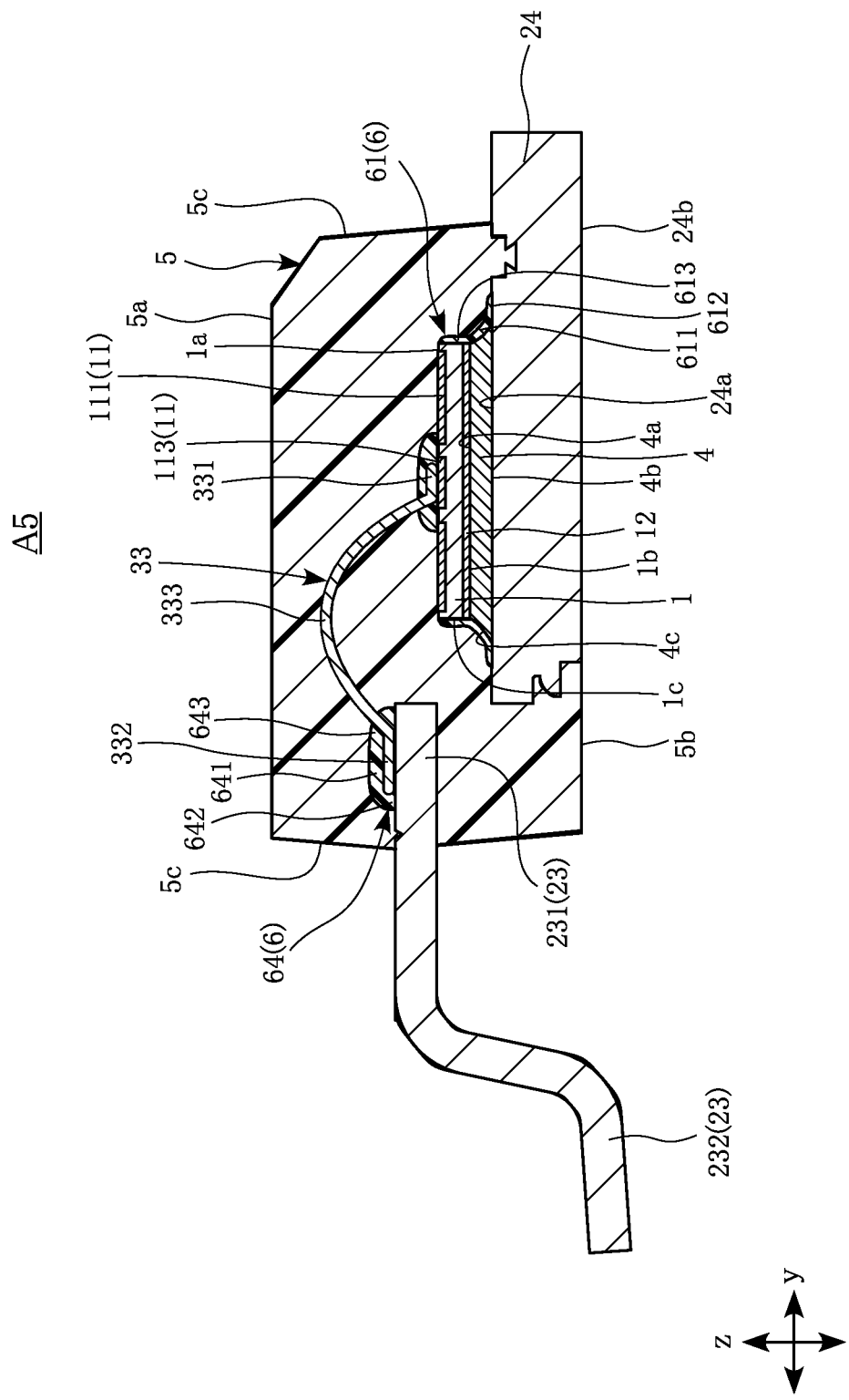
FIG. 31 is a sectional view taken along line XXXI-XXXI in FIG. 29.

FIGS. 29-31 show a semiconductor device according to a fifth embodiment. The semiconductor device A5 of the fifth embodiment differs from the semiconductor device A4 in formation region of the resin composition 6. Specifically, the resin composition 6 of the semiconductor device A5 further includes an element-side covering portion 65. FIG. 29 is a plan view showing the semiconductor device A5 and corresponds to FIG. 25 of the fourth embodiment. FIG. 30 is a sectional view taken along line XXX-XXX in FIG. 29. FIG. 31 is a sectional view taken along line XXXI-XXXI in FIG. 29.

The element-side covering portion 65 covers the bonded region where the second wire 32 and the second front-surface electrode 112 are bonded, and the bonded region where the third wire 33 and the third front-surface electrode 113 are bonded. As viewed in plan, the element-side covering portion 65 spreads from each of these bonded regions to the surroundings. As viewed in plan, the element-side covering portion 65 overlaps with part of the first front-surface electrode 111 and covers the part of the first front-surface electrode 111. However, the element-side covering portion 65 (resin composition 6) does not cover the portion (the region R1 shown in FIG. 29) of the first front-surface electrode 111 on which the first wires 31 may be bonded. In the example shown in FIG. 29, the element-side covering portion 65 is connected to the die-pad-side covering portion 61. However, the element-side covering portion 65 may not be connected to the die-pad-side covering portion 61.

The semiconductor device A5 includes the resin composition 6, as with the semiconductor device A1. The resin composition 6 covers the bonded region (the die-pad-side bonded region or the lead-side bonded region) where conductive members (e.g., the conductive bonding material 4 or the first wires 31) and the lead frame 2 are bonded. Thus, in the semiconductor device A5 again, malfunctions due to detachment of the sealing resin 5 are prevented, as with the semiconductor device A1.

In the semiconductor device A5, the resin composition 6 includes the element-side covering portion 65. The element-side covering portion 65 covers the bonded region of the second wire 32 and the second front-surface electrode 112, and the bonded region of the third wire 33 and the third front-surface electrode 113. With such an arrangement, the resin composition 6 serves as an adhesive to improve the bonding strength between the sealing resin 5 and the bonded region of the second wire 32 and the second lead 22, as well as the bonding strength between the sealing resin 5 and the bonded region of the third wire 33 and the third lead 23. Thus, the semiconductor device A5 prevents detachment of the sealing resin 5 from these bonded regions, thereby preventing malfunctions due to detachment of the sealing resin 5. With the provision of the element-side covering portion 65, part of the element front surface 1a (mainly the second front-surface electrode 112 and the third front-surface electrode 113) is covered with the resin composition 6. However, covering part of the element front surface 1a with the resin composition 6 does not considerably degrade the heat dissipation, because during the operation of the semiconductor device A5 the second front-surface electrode 112 and the third front-surface electrode 113 are less likely to generate heat as compared with the first front-surface electrode 111.

The fifth embodiment shows the example in which the element-side covering portion 65 covers part of the first front-surface electrode 111, but the present disclosure is not limited to this. For example, the element-side covering portion 65 may not cover the first front-surface electrode 111. That is, the entirety of the first front-surface electrode 111 may be exposed from the resin composition 6.

The fifth embodiment shows the example in which the resin composition 6 includes the die-pad-side covering portion 61, the lead-side covering portions 62, 63, 64 and the element-side covering portion 65, but the resin composition 6 may not include all of these. That is, it is only necessary that the resin composition 6 includes at least one of these covering portions.

Note that one or both of the lead-side covering portion 63 of the fourth embodiment and the element-side covering portion 65 of the fifth embodiment may be added to the semiconductor device A3.

The first through the fifth embodiments show the examples in which the semiconductor element 1 has a vertical structure with the front-surface electrode 11 and the back-surface electrode 12, but the present disclosure is not limited to this. For example, the semiconductor element 1 may have a horizontal structure that does not include the back-surface electrode 12 (but includes the front-surface electrode 11). In this case, the conductive bonding material 4 may be Ag paste rather than solder.

The first through the fifth embodiments show the example in which the die pad 24 of the lead frame 2 is exposed from the sealing resin 5 at the pad back surface 24b, but the present disclosure is not limited to such an arrangement, and the pad back surface 24b may be covered with the sealing resin 5.

The first through the fifth embodiments show the example in which the semiconductor devices A1-A5 are of the surface mount type. However, the present disclosure is not limited to the surface mount type and is also applicable to the lead insertion type. Also, in the semiconductor device A1-A5, the lead frame 2 projects from the sealing resin 5 as viewed in plan, but the present disclosure is not limited to this. For example, the present disclosure may be applied to e.g. a non-lead package type in which the lead frame 2 does not project from the sealing resin 5 as viewed in plan. In this way, the present disclosure is not limited to the semiconductor device of a particular package type, but may be applicable to various package types.

The semiconductor device and the manufacturing method according to the present disclosure are not limited to the foregoing embodiments. The specific configuration of each part of the semiconductor device and the specific process in each step of the manufacturing method according to the present disclosure may be varied in design in many ways.

The invention claimed is:

1. A semiconductor device comprising:
   a semiconductor element having an element front surface and an element back surface facing away from each other in a first direction, the semiconductor element further having an element side surface connected to the element front surface and the element back surface;
   a lead frame including a die pad and a lead spaced apart from the die pad, the semiconductor element being mounted on the die pad;
   a conductive member bonded to the lead frame, the conductive member electrically connecting the semiconductor element and the lead frame;
   a resin composition; and
   a sealing resin covering part of the lead frame, the semiconductor element and the resin composition,
   wherein the conductive member incudes a conductive bonding material bonding the semiconductor element and the die pad, the resin composition comprises a first portion covering at least a part of the die pad, a second portion covering at least a part of the conductive member, a third portion covering at least a part of the element side surface, and a fourth portion covering at least a part of the element front surface, wherein the first portion, the second portion, the third portion and the fourth portion are continuous with each other.

2. The semiconductor device according to claim 1, wherein the die pad has a pad front surface facing a direction in which the element front surface faces and a pad back surface facing a direction in which the element back surface faces, and
the pad front surface and the element back surface face each other.

3. The semiconductor device according to claim 2, wherein the semiconductor element includes a back-surface electrode formed on the element back surface, and
the conductive bonding material electrically connects the back-surface electrode and the die pad.

4. The semiconductor device according to claim 3, wherein the conductive bonding material has an element contact surface in contact with the back-surface electrode, a die-pad contact surface in contact with the die pad, and a connecting surface connected to the element contact surface and the die-pad contact surface, and
the first portion of the resin composition is interposed between the at least a part of the die pad and the sealing resin.

5. The semiconductor device according to claim 4, wherein the second portion of the resin composition is interposed between the at least a part of the conductive member and the sealing resin.

6. The semiconductor device according to claim 4, wherein the third portion of the resin composition is interposed between the at least a part of the element side surface and the sealing resin.

7. The semiconductor device according to claim 6, wherein the fourth portion of the resin composition is interposed between the at least a part of the element front surface and the sealing resin.

8. The semiconductor device according to claim 3, wherein the conductive bonding material comprises solder.

9. The semiconductor device according to claim 3, wherein the pad back surface is exposed from the sealing resin.

10. The semiconductor device according to claim 2, wherein the semiconductor element includes a front-surface electrode formed on the element front surface,
the conductive member includes a wire bonded to the front-surface electrode and the lead to electrically connect the front-surface electrode and the lead.

11. The semiconductor device according to claim 10, wherein the wire includes a first bond part bonded to the front-surface electrode and a second bond part bonded to the lead.

12. The semiconductor device according to claim 11, wherein the wire further includes a line part connecting the first bond part and the second bond part, and
the line part includes a sealing-resin contact region that is in contact with the sealing resin along an entire circumference thereof.

13. The semiconductor device according to claim 1, wherein the semiconductor element is a power semiconductor chip.

* * * * *